US012633342B2

(12) United States Patent
Carissimi et al.

(10) Patent No.: US 12,633,342 B2
(45) Date of Patent: May 19, 2026

(54) IN-MEMORY COMPUTATION SYSTEM USING A SEGMENTED MEMORY ARCHITECTURE WITH LOCAL MEMORY ARRAY SELECTION FOR SIMULTANEOUSLY PERFORMING MULTIPLE INDEPENDENT OPERATIONS

(71) Applicant: STMicroelectronics International N.V., Geneva (CH)

(72) Inventors: Marcella Carissimi, Treviolo (IT); Marco Pasotti, Travaco' Siccomario (IT); Riccardo Zurla, Binasco (IT)

(73) Assignee: STMicroelectronics International N.V., Geneva (CH)

( * ) Notice: Subject to any disclaimer, the term of this patent is extended or adjusted under 35 U.S.C. 154(b) by 182 days.

(21) Appl. No.: 18/241,812

(22) Filed: Sep. 1, 2023

(65) Prior Publication Data

US 2025/0078922 A1 Mar. 6, 2025

(51) Int. Cl.
*G11C 13/00* (2006.01)
*G06F 7/523* (2006.01)
*H03M 1/12* (2006.01)

(52) U.S. Cl.
CPC ............ *G11C 13/003* (2013.01); *G06F 7/523* (2013.01); *G11C 13/0004* (2013.01); *G11C 13/0026* (2013.01); *G11C 13/0028* (2013.01); *H03M 1/12* (2013.01)

(58) Field of Classification Search
CPC .............. G11C 13/003; G11C 13/0004; G11C 13/0026; G11C 13/0028; G11C 13/0069; G11C 11/54; G11C 7/1006; G11C 5/04; G11C 8/08; G11C 8/10; G06F 7/523; G06F 15/7821; H03M 1/12
See application file for complete search history.

(56) References Cited

U.S. PATENT DOCUMENTS

| | | | | |
|---|---|---|---|---|
| 10,713,011 | B2 * | 7/2020 | Tiwari | G11C 7/1006 |
| 11,061,646 | B2 * | 7/2021 | Sumbul | G11C 8/10 |
| 11,294,599 | B1 * | 4/2022 | Diamant | G06N 3/02 |
| 2006/0062483 | A1 * | 3/2006 | Kondo | H04N 19/51 |
| | | | | 382/253 |

(Continued)

OTHER PUBLICATIONS

EPO Search Report and Written Opinion for counterpart EP Appl. No. 24193576.6, report dated Jan. 31, 2025, 9 pgs.

*Primary Examiner* — Khamdan N. Alrobaie
(74) *Attorney, Agent, or Firm* — Crowe & Dunlevy LLC

(57) ABSTRACT

A memory array includes memory cells arranged in a matrix with cell rows coupled to word lines and cell columns coupled to output bit lines. A control circuit maps a first group of memory cells to a first in-memory compute operation producing computation output signals on first output bit lines from a first matrix vector multiplication of a first input vector with a first group of computation weights stored in the first group of memory cells and maps a second group of memory cells to a second in-memory compute operation producing computation output signals on second output bit lines, different from the first output bit lines, from a second matrix vector multiplication of a second input vector, different from the first input vector, with a second group of computation weights stored in the second group of memory cells. The first and second in-memory compute operations are substantially simultaneously executed.

15 Claims, 17 Drawing Sheets

(56)  References Cited

U.S. PATENT DOCUMENTS

| | | | |
|---|---|---|---|
| 2006/0215440 A1* | 9/2006 | Cho | G11C 13/0004 |
| | | | 365/148 |
| 2019/0259463 A1* | 8/2019 | Jean | G11C 16/26 |
| 2020/0004553 A1* | 1/2020 | Li | G06F 9/3885 |
| 2021/0089390 A1* | 3/2021 | Lee | G06F 7/523 |
| 2021/0151106 A1* | 5/2021 | Wang | G06F 17/16 |
| 2022/0231050 A1 | 7/2022 | Young et al. | |
| 2023/0008833 A1 | 1/2023 | Rawat et al. | |
| 2023/0012303 A1 | 1/2023 | Dhori et al. | |
| 2023/0022347 A1* | 1/2023 | Deshpande | G11C 7/1069 |
| 2023/0074229 A1 | 3/2023 | Jia et al. | |
| 2023/0168891 A1* | 6/2023 | Yao | G06F 9/3877 |
| | | | 712/220 |
| 2023/0370082 A1* | 11/2023 | Lee | G11C 11/412 |
| 2023/0386564 A1* | 11/2023 | Dhori | G11C 11/419 |

\* cited by examiner

Array_Column_Select_1<7:0>
Local_Array_Select<0> ⟩7:0⟩ → CSel₁₁<7:0>

Array_Column_Select_1<7:0>
Local_Array_Select<4> ⟩7:0⟩ → CSel₁₂<7:0>

Array_Column_Select_1<7:0>
Local_Array_Select<12> ⟩7:0⟩ → CSel₁₃<7:0>

Array_Column_Select_1<7:0>
Local_Array_Select<12> ⟩7:0⟩ → CSel₁₄<7:0>

IN-MEMORY COMPUTATION SYSTEM USING A SEGMENTED MEMORY ARCHITECTURE WITH LOCAL MEMORY ARRAY SELECTION FOR SIMULTANEOUSLY PERFORMING MULTIPLE INDEPENDENT OPERATIONS

TECHNICAL FIELD

Embodiments relate to an in-memory computation circuit and, in particular, to the use of a segmented memory architecture including a matrix of local memory arrays with selection of local memory arrays for supporting simultaneous performance of multiple independent in-memory computation operations.

BACKGROUND

An in-memory computation (IMC) system stores information in the bit cells of a memory array and performs calculations at the bit cell level. An example of a calculation performed by an IMC system is a multiply and accumulate (MAC) operation or matrix vector multiplication (MVM) operation where an input array (or vector) of numbers (X values, also referred to as the feature or coefficient data) are multiplied by an array of computational weights (g values) stored in the memory and the products are added together to produce an output array of numbers (Y values).

$$\begin{bmatrix} Y_1 \\ Y_2 \\ \vdots \\ Y_m \end{bmatrix} = \begin{bmatrix} g_{11} & g_{12} & \cdots & g_{1n} \\ g_{21} & g_{22} & \cdots & g_{2n} \\ \vdots & \vdots & \vdots & \vdots \\ g_{m1} & g_{m2} & \cdots & g_{mn} \end{bmatrix} \times \begin{bmatrix} X_1 \\ X_2 \\ \vdots \\ X_n \end{bmatrix}$$

$$\begin{cases} Y_1 = g_{11} \times X_1 + g_{12} \times X_2 + \cdots + g_{1n} \times X_n \\ Y_2 = g_{21} \times X_1 + g_{22} \times X_2 + \cdots + g_{2n} \times X_n \\ \qquad \vdots \\ Y_m = g_{m1} \times X_1 + g_{m2} \times X_2 + \cdots + g_{mn} \times X_n \end{cases}$$

By performing these calculations at the bit cell level in the memory, the IMC system does not need to move data back and forth between a memory device and a computing device. Thus, the limitations associated with data transfer bandwidth between devices are obviated and the computation can be performed with lower power consumption.

Reference is made to FIG. 1 which shows a schematic diagram of an in-memory computation circuit 10. The circuit 10 utilizes a memory array 12 formed by a plurality of memory cells $14_{AB}$ arranged in a matrix format having m columns and n rows. Each memory cell $14_{AB}$ is programmed to store a computational weight $g_{AB}$ where A is an integer from 1 to m and B is an integer from 1 to n, such computational weight also referred to as kernel data, for an in-memory compute operation. Each computational weight may be expressed in a binary format (where the weight has either a logic "1" value or a logic "0" value) or in a multi-ary format (where the weight has three or more possible values). The value of the computational weight is represented, for example, by a programmable conductance in the memory cell 14.

In an embodiment of the memory array 12, each memory cell $14_{AB}$ comprises a phase change memory (PCM) cell formed by a select circuit (MOSFET transistor, BJT transistor, diode device, etc.) 14t operating as a switching element and a variable resistive element 14r providing a programmable conductance. In the case of a MOSFET transistor for the select circuit 14t, the control node (gate) of the MOSFET transistor is connected to the word line WL. The source-drain path of the MOSFET transistor is connected in series with the variable resistive element 14r between the bit line BL and a reference node (for example, a source line or ground). More specifically, a drain of the MOSFET transistor is connected to a first terminal of the variable resistive element 14r, the source of the MOSFET transistor is connected to the reference node, and the second terminal of the variable resistive element 14r is connected to the bit line BL.

As is well known to those skilled in the art, a PCM-type memory cell 14 is configured to store data using a phase change material (such as a chalcogenide) that is capable of stably transitioning between amorphous and crystalline phases according to an amount of heat transferred thereto. The amorphous and crystalline phases exhibit two (in binary configuration) or more (in multi-ary configuration) distinct resistances corresponding to the variable resistive element 14r, in other words two or more distinct conductances, which are used to distinguish two or more distinct logic values or states programmable into the memory cell. The amorphous phase exhibits a relatively higher resistance (i.e., a lower conductance) and thus the current sunk from the bit line BL by the memory cell programmed in this state when selected by assertion of the word line signal at the gate of the select circuit 14t is relatively smaller. Conversely, the crystalline phase exhibits a relatively lower resistance (i.e., a higher conductance) and thus the current sunk from the bit line BL by the memory cell programmed in this state when selected by assertion of the word line signal at the gate of the select circuit 14t is relatively larger.

In an embodiment for a specific, but non-limiting, example for two distinct logic values in the binary configuration: the amorphous phase may represent programming of the memory cell to logic "0" (or reset state) for the associated coefficient weight and the crystalline phase may represent programming of the memory cell to logic "1" (or set state) for the associated coefficient weight.

It will be understood that other memory cell types could instead be used for the array 12. For example, magnetoresistive random access memory (MRAM) cells or resistive random access memory (RRAM) cells could be used.

Each memory cell $14_{AB}$ includes a word line WL<B> and a bit line BL<A>. The memory cells 14 in a common row of the matrix are connected to each other through a common word line WL<B>. The memory cells 14 in a common column of the matrix are connected to each other through a common bit line BL<A>.

Each word line WL<B> is driven by a word line driving circuit 16 with a pulsed word line signal generated by a row controller circuit 18. The word line driving circuit 16 may be implemented as a CMOS driver circuit (for example, a series connected p-channel and n-channel MOSFET transistor pair forming a logic inverter circuit).

The row controller circuit 18 receives an address signal (Address) for the in-memory compute operation and in response thereto performs the function of selecting which ones of the word lines WL<1> to WL<n> are to be simultaneously accessed (or actuated) in parallel during an analog in-memory compute operation. The row controller circuit 18 further receives the feature or coefficient data $X_B$ for the in-memory compute operation and in response thereto controls, for each corresponding actuated word line WL<B>, the width (i.e., the on time $T_{ON}$) of the generated pulsed word line signal. This functionality is a form of a pulse width modulation (PWM) control for the applied word line signals dependent on the digital value of the received feature or coefficient data X.

FIG. 1 illustrates, by way of example only, the simultaneous actuation of all word lines WL<1>, . . . , WL<n> in response to the received Address with pulsed word line signals having pulse widths set by the digital value of the corresponding coefficient data $X_1$, . . . , $X_n$. It will, of course, be understood that the analog in-memory compute operation may instead utilize a simultaneous actuation of fewer than all rows of the memory array (through either Address signal selection or through a zero value for a given coefficient data $X_B$).

The analog signal $Y_A$ developed on the bit line BL<A> is dependent on the logic value of the computational weight $g_{AB}$ stored in the B=1 to n memory cells $14_{AB}$ of the column and the widths of the pulsed word line signals applied to the word lines WL<1>, . . . , WL<n> for those memory cells 14. More specifically, it will be understood that each memory cell $14_{AB}$ contributes a bit line BL discharge current that is proportional to $X_B \times g_{AB}$. So, in the example shown in FIG. 1 where the word line signals 16 are simultaneously applied to the word lines WL<1>, . . . , WL<n>, the analog signal $Y_1$ developed on the bit line BL<1> is proportional to the sum of discharge currents due to $X_1 \times g_{11}$, $X_2 \times g_{12}$, . . . , and $X_n \times g_{1n}$.

A column processing circuit 20 senses and samples the analog signal $Y_A$ on the bit line BL<A> for each of the m columns and converts the analog signal to a corresponding digital signal $dY_A$ using analog-to-digital converter circuitry. Although FIG. 1 illustrates that one analog-to-digital converter (ADC) is provided for each column, it will be understood that ADC resources in the column processing circuit 20 could instead be shared by multiple columns using time division multiplexing. The column processing circuit 20 may further include digital signal processing circuitry for performing digital computations and calculations on the digital signals $dY_A$ to generate a decision output for the in-memory compute operation.

Although not explicitly shown in FIG. 1, it will be understood that the circuit 10 further includes conventional row decode, column decode, and read-write circuits known to those skilled in the art for use in connection with writing the computational weights to, and reading data from, the memory cells 14 of the memory array 12. This operation is referred to as a conventional memory access mode and is distinguished from the analog in-memory compute operation discussed above.

SUMMARY

In an embodiment, an in-memory computation circuit comprises: a memory including a plurality of memory cells arranged in a matrix with a plurality of cell rows and a plurality of cell columns, wherein each cell row is associated with a word line connected to the memory cells in the cell row, and wherein each cell column is associated with a global bit line; wherein the memory is segmented into a plurality of local memory arrays arranged in a matrix with a plurality of array rows and a plurality of array columns; a word line driver for each array row that is selectively enabled in response to a row select signal to drive word lines of the array row; wherein each local memory array includes a plurality of local bit lines connected to memory cells in the cell columns and a column decoder circuit configured to selectively connect the local bit lines to the global bit lines of the array column in response to a column select signal;

and a control circuit configured to generate row select signals for the word lines drivers and column select signals for the column decoder circuits to map a first group of one or more local memory arrays to participate in a first in-memory compute operation producing computation output signals on first ones of the global bit lines and map a second group of one or more local memory arrays, different from the first ones of the local memory arrays, to participate in a second in-memory compute operation producing computation output signals on second ones of the global bit lines, different from the first ones of the global bit lines; and wherein the first and second in-memory compute operations are substantially simultaneously executed.

In an embodiment, an in-memory computation circuit comprises: a memory array including a plurality of memory cells arranged in a matrix with plural cell rows and plural cell columns, wherein each cell row is associated with a word line coupled to the memory cells in the cell row, and wherein each cell column is associated with an output bit line coupled to memory cells in the cell column; a control circuit configured to map a first group of memory cells to participate in a first in-memory compute operation producing computation output signals on first ones of the output bit lines from a first matrix vector multiplication of a first input vector with a first group of computation weights stored in the first group of memory cells and map a second group of memory cells to participate in a second in-memory compute operation producing computation output signals on second ones of the output bit lines, different from the first ones of the output bit lines, from a second matrix vector multiplication of a second input vector, different from the first input vector, with a second group of computation weights stored in the second group of memory cells; and wherein the first and second in-memory compute operations are substantially simultaneously executed.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 2:
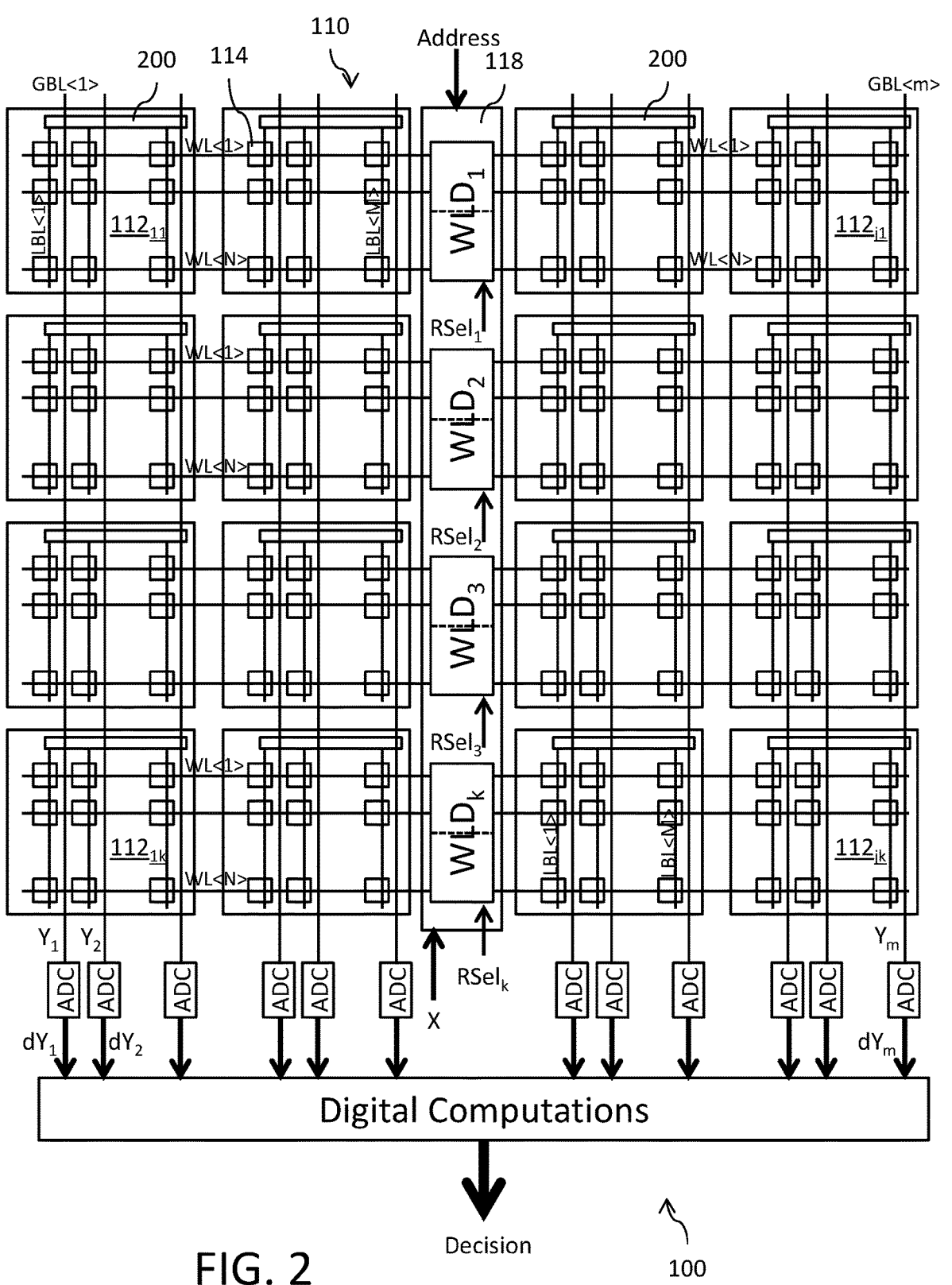
FIG. 2 is a schematic diagram of an embodiment for an in-memory computation circuit.

Reference is now made to FIG. 2 which shows a schematic diagram of an analog in-memory computation circuit

100 including a memory 110 formed by a plurality of memory cells 114 arranged in a matrix format having m cell columns and n cell rows. The memory 110 may, thus, have a same size as the memory 10 of FIG. 1, but the memory 110 has a different architectural configuration. The memory 110 is segmented to form a plurality of local memory arrays 112$_{cd}$ arranged in a matrix format having j array columns and k array rows (the local memory arrays 112$_{cd}$ each array row forming a memory row sector and the local memory arrays 112$_{cd}$ each array column forming a memory column sector), where c is an integer from 1 to j and d is an integer from 1 to k. FIG. 2 shows, for example only and without limitation, an implementation where j=4 and k=4, for a total of sixteen local memory arrays 112 in an 4×4 matrix with four memory row sectors and four memory column sectors.

Figure 3:
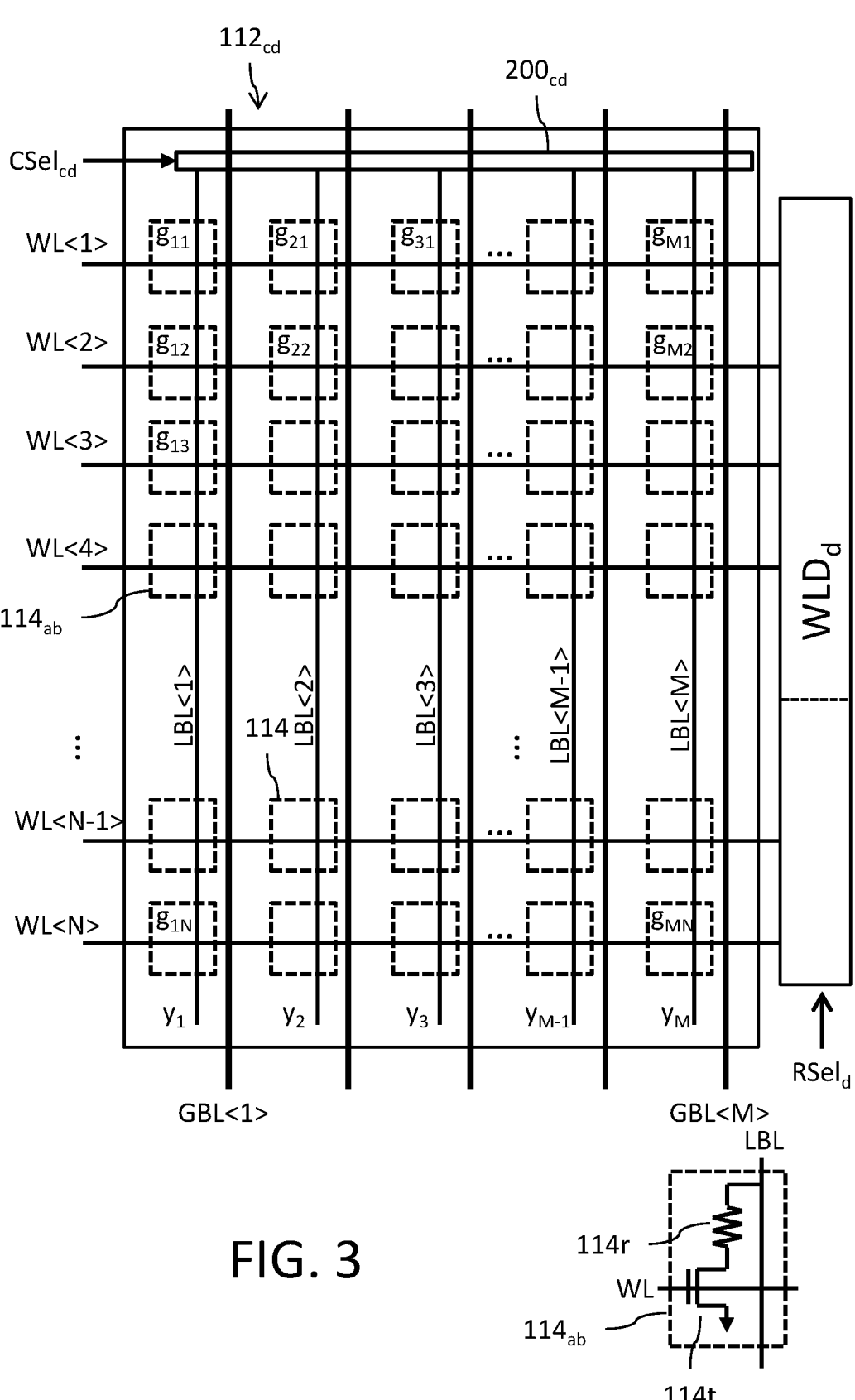
FIG. 3 is a schematic diagram of a local memory array used in the circuit of FIG. 2.

As shown in FIG. 3, each local memory array 112$_{cd}$ is formed by a plurality of memory cells 114$_{ab}$ arranged in a matrix format having M cell columns and N cell rows, where a is an integer from 1 to M (M=m/j) and b is an integer from 1 to N (N=n/k). The memory cells 114$_{ab}$ in a same cell row b of the matrix for the local memory array 112 are connected to each other through a word line WL<b>. The memory cells 114$_{ab}$ in a same cell column a of the matrix for the local memory array 112 are connected to each other through a local bit line LBL<a>.

Each memory cell 114 comprises a phase change memory (PCM) cell formed by a select circuit (MOSFET transistor, BJT transistor, diode device, etc.) 114$t$ operating as a switching element and a variable resistive element 114$r$ providing a programmable conductance. In the case of a MOSFET transistor for the select circuit 114$t$, the control node (gate) of the MOSFET transistor is connected to the word line WL. The source-drain path of the MOSFET transistor is connected in series with the variable resistive element 114$r$ between a local bit line LBL and a reference node (for example, a source line or ground). More specifically, a drain of the MOSFET transistor is connected to a first terminal of the variable resistive element 114$r$, the source of the MOSFET transistor is connected to the reference node, and the second terminal of the variable resistive element 14$r$ is connected to the local bit line LBL.

It will be understood that other memory cell types could instead be used for each of the local memory arrays 112. For example, magnetoresistive random access memory (MRAM) cells or resistive random access memory (RRAM) cells could be used.

Each memory cell 114$_{ab}$ is programmed to store a corresponding computational weight g$_{ab}$, such computational weight also referred to as kernel data, for an in-memory compute operation(s). Each computational weight may be expressed in a binary format (where the weight has either a logic "1" value or a logic "0" value) or in a multi-ary format (where the weight has three or more possible values). The value of the computational weight is represented, for example, by a programmable conductance in the memory cell 114. The computational weight data stored in each local memory array 112$_{cd}$ are likely to be different, but may in some cases be the same or have some data shared in common between multiple local memory arrays.

Figure 1:
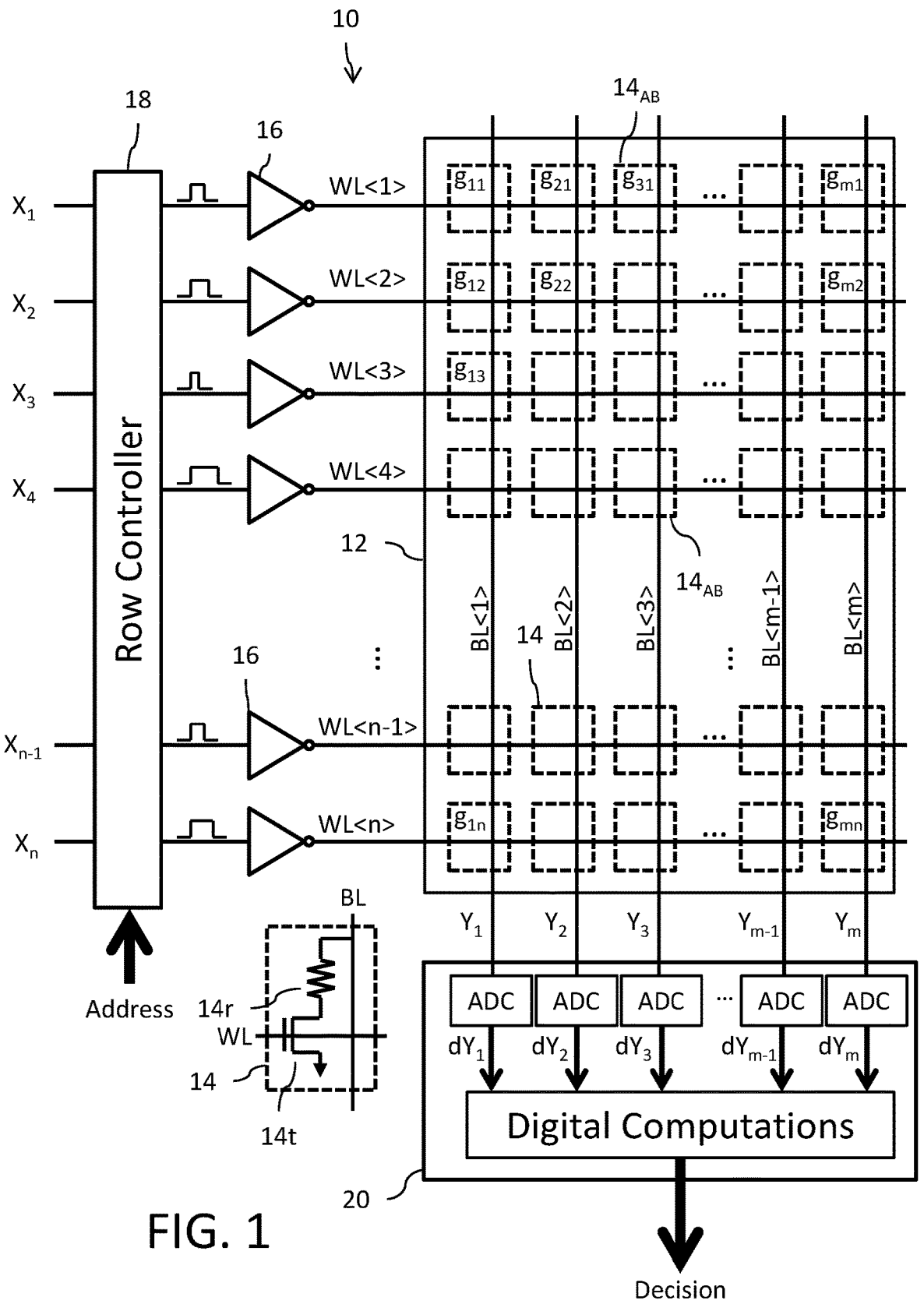
FIG. 1 is a schematic diagram of an embodiment for an in-memory computation circuit.

The operation of each local memory array 112 to participate in an in-memory compute operation is analogous to the operation for the memory array 12 shown in FIG. 1, but on a reduced scale. Selected ones of the word lines WL<1> to WL<N> are simultaneously accessed (or actuated) in parallel during the analog in-memory compute operation. The width (i.e., the on time T$_{ON}$) of the generated pulsed word line signal is controlled by the feature or coefficient data X$_b$ for the in-memory compute operation. For example, simultaneous actuation of all word lines WL<1>, . . . , WL<N> with pulsed word line signals having pulse widths set by the digital value of the corresponding coefficient data X$_1$, . . . , X$_N$. The analog signal y$_a$ developed on a given local bit line LBL<a> is dependent on the logic value of the computational weight g$_{ab}$ stored in the b=1 to N memory cells 114 of the cell column a and the widths of the pulsed word line signals applied at the b cell rows to the word lines WL<1>, . . . , WL<N> for those memory cells 114. More specifically, it will be understood that each memory cell 114 contributes a local bit line LBL discharge current that is proportional to X$_b$×g$_{ab}$. So, in the example where the word line signals are simultaneously applied to the word lines WL<1>, . . . , WL<N>, the analog signal y$_1$ developed on the local bit line LBL<1> is proportional to the sum of discharge currents due to X$_1$×g$_{11}$, X$_2$×g$_{12}$, . . . , and X$_n$×g$_{1N}$. The analog signal y$_a$ on each local bit line LBL<a> for a corresponding cell column can then be sensed, sampled and converted to a corresponding digital signal using analog-to-digital converter circuitry. Digital computations and calculations can then be performed on the digital signals to generate a decision output for the in-memory compute operation.

With additional reference once again to FIG. 2, the word lines WL<b> of each local memory array 112 for an array row d (corresponding to a memory row sector) are shared by all local memory arrays 112 in that array row of the memory 110. There is a corresponding word line driver WLD$_d$ circuit provided for each array row, and this WLD circuit is connected to the word lines WL<1>, . . . , WL<N> and configured to apply the pulsed word line signals with pulse widths dependent on the feature or coefficient data X$_b$ for the in-memory compute operation. As shown, for example, in FIG. 1, each WLD circuit includes a word line driving circuit (CMOS driver, reference 16) for each word line WL. Actuation of each WLD$_d$ circuit is controlled in response to an array row selection signal RSel$_d$. For example, if the row selection signal RSel$_d$ is in a first logic state indicating that at least one local memory array 112$_{cd}$ in the array row d connected to the WLD$_d$ circuit is participating in a given in-memory compute operation, then that WLD$_d$ circuit is enabled to drive the word lines WL of the local memory arrays 112$_{cd}$ in that row through the driving circuits 16 with word line signals for the given in-memory compute operation. Conversely, if the row selection signal RSel$_d$ is in a second logic state indicating that no local memory array 112$_{cd}$ in the array row d connected to the WLD$_d$ circuit is participating in a given in-memory compute operation, then that WLD$_d$ circuit is disabled and no word line signals are applied to the word lines WL of that row.

For the memory 110 formed by the matrix of local memory arrays 112$_{cd}$, there are a total of m columns of memory cells 114 and n rows of memory cells 114, wherein m=j*M and n=k*N. The m memory cells 114 in the cell row of the memory 110 share a common word line WL. Each of the m columns of memory cells 114 in the cell column of the memory 110 is associated with a global bit line GBL<m>. A column decode circuit 200 is provided for each local memory array 112$_{cd}$ to selectively couple, for example electrically connect through a transistor switch, each of the local bit lines LBL of the local memory arrays 112 to a cell column corresponding one of the global bit lines GBL of the memory 110 in response to an array column selection signal CSel$_{cd}$. For example, if the array column selection signal CSel$_{cd}$ is in a first logic state indicating that the local memory array 112$_{cd}$ is participating in a given in-memory compute operation, the local bit lines LBL in that local memory array $112_{cd}$ are connected to the corresponding global bit lines GBL provided for the array column. Conversely, if the column selection signal $CSel_{cd}$ is in a second logic state indicating that the local memory array $112_{cd}$ is not participating in a given in-memory compute operation, the local bit lines LBL local memory array $112_{cd}$ are disconnected from the corresponding global bit lines GBL.

The granularity of control discussed above is at the local memory array level meaning that the connection/disconnection between local bit lines LBL and global bit lines GBL is all or none for the local memory array of the memory column sector. As discussed elsewhere herein, in another implementation a finer granular control over the connection/disconnection between individual local bit lines LBL and global bit lines GBL within each local memory array is all also possible through a multi-bit array column selection signal $CSel_{cd}$.

The pulsed word line signals for the in-memory compute operation(s) are generated by a row controller circuit 118 and selectively applied, through the $WLD_d$ circuits in response to the row selection signals $RSel_d$, to the word lines WL of the local memory arrays $112_{cd}$. The analog signals $y_a$ on each local bit line LBL<a> are selectively applied, through the column decode circuits 200, to the global bit lines GBL<m>. The analog signal $Y_m$ developed on each global bit line GBL<m> is dependent on the analog signals $y_a$ from each local bit line LBL<a> selected through the column decode circuits 200. For example, the analog signal $Y_1$ developed on the global bit line GBL<1> is proportional to the sum of discharge currents due to the analog signals $y_1$ from the one or more local bit lines LBL<1> in the local memory arrays $1121d$ selected by the column selection signals $CSel_{1d}$.

Column processing circuitry senses and samples the analog signal $Y_m$ on each global bit line GBL<m> and converts the analog signal to a corresponding digital signal $dY_m$ using analog-to-digital converter circuitry. Although FIG. 2 illustrates that one analog-to-digital converter (ADC) is provided for each global bit line GBL column, it will be understood that ADC resources in the column processing circuit could instead be shared by multiple global bit line columns using time division multiplexing. The column processing circuit may further include digital signal processing circuitry for performing digital computations and calculations on the digital signals $dY_m$ to generate a decision output for the in-memory compute operation(s).

The architecture of the in-memory computation circuit 100 including the memory 110 formed by the matrix of local memory arrays $112_{cd}$ enables the simultaneous performance of two or more independent in-memory compute operations. This is accomplished through the generation of the column selection signals $CSel_{cd}$ and the row selection signals $RSel_d$ which map a certain one or ones of the local memory arrays $112_{cd}$ to each of the in-memory compute operations. By controlling the mapping operation so that each in-memory compute operation uses a different group of global bit lines GBL<m> for the computation generated analog signals $Y_m$ of the matrix vector multiplication, the two or more in-memory compute operations can be performed substantially simultaneously and independently of each other. In this context, substantially simultaneously means that the timing of execution of the two or more in-memory compute operations occurs simultaneously or with at least a partial overlap in time. Furthermore, in this context independently means that the two or more in-memory compute operations produce separate outputs from the calculation inputs. This may be better understood by reference to a few examples.

Figure 4A:
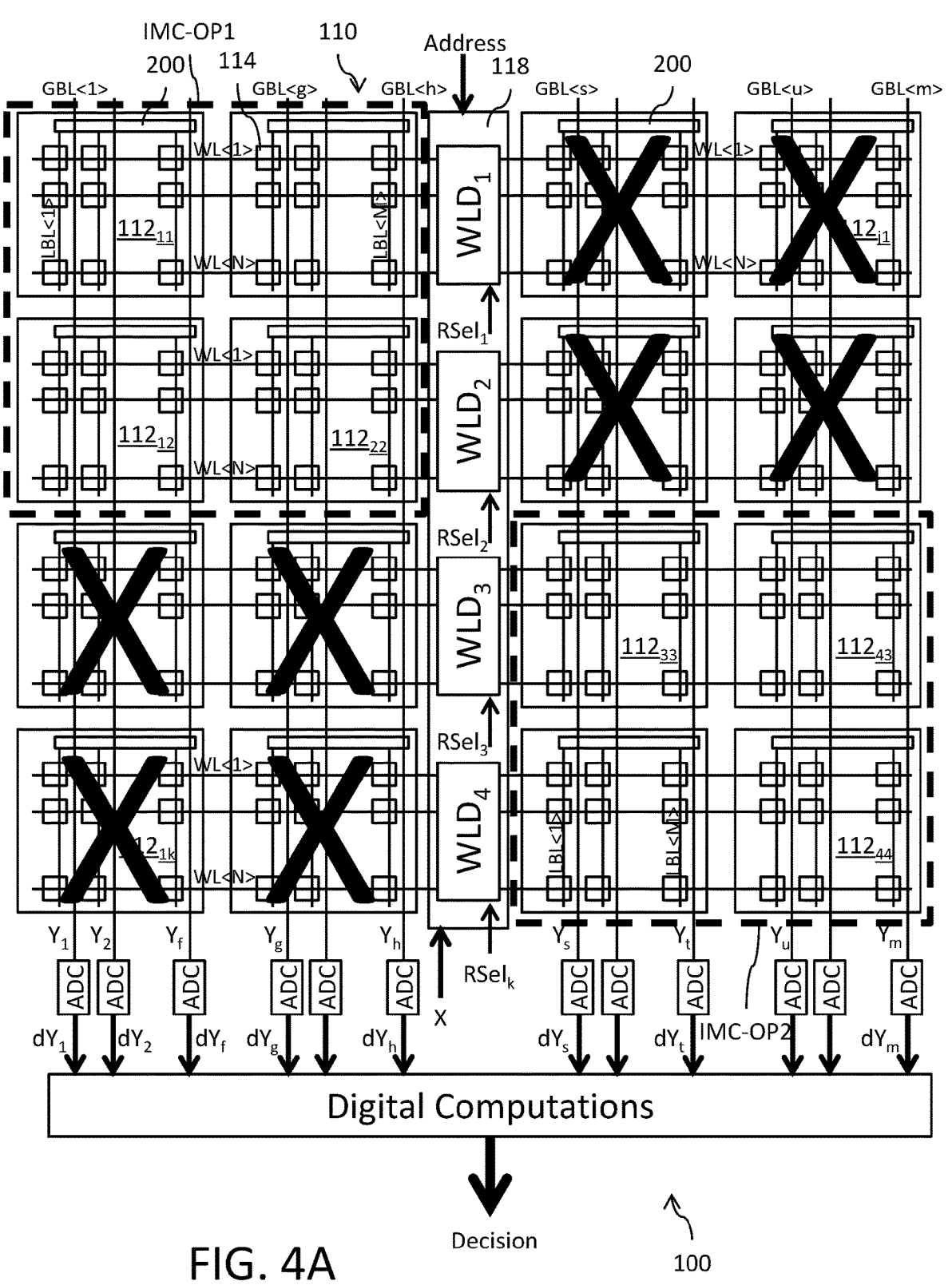
FIG. 4A-4D illustrate examples for configuring the in-memory computation circuit in support of performing substantially simultaneous and independent in-memory compute operations.

Example A: the column selection signals $CSel_{cd}$ and the row selection signals $RSel_d$ are generated to map local memory arrays $112_{11}$, $112_{21}$, $112_{12}$ and $112_{22}$ to a first in-memory compute operation (IMC-OP1) and map local memory arrays $112_{33}$, $112_{43}$, $112_{34}$ and $112_{44}$ to a second in-memory compute operation (IMC-OP2). This can be accomplished, for example: a) by asserting row selection signals $RSel_1$, $RSel_2$, $RSel_3$ and $RSel_4$, which will enable the $WLD_1$, $WLD_2$, $WLD_3$ and $WLD_4$ circuits; b) by asserting the column selection signals $CSel_{11}$, $CSel_{21}$, $CSel_{12}$ and $CSel_{22}$ which will enable the column decode circuits 200 for the local memory arrays $112_{11}$, $112_{21}$, $112_{12}$ and $112_{22}$ participating in the first in-memory compute operation (IMC-OP1) and asserting the column selection signals $CSel_{33}$, $CSel_{43}$, $CSel_{34}$ and $CSel_{44}$ which will enable the column decode circuits 200 for the local memory arrays $112_{33}$, $112_{43}$, $112_{34}$ and $112_{44}$ participating in the second in-memory compute operation (IMC-OP2); and c) by deasserting the column selection signals $CSel_{13}$, $CSel_{23}$, $CSel_{14}$, $CSel_{24}$, $CSe_{31}$, $CSel_{41}$, $CSel_{32}$ and $CSel_{42}$, which will disable the column decode circuits 200 for the local memory arrays $112_{13}$, $112_{23}$, $112_{14}$, $112_{24}$, $112_{31}$, $112_{41}$, $112_{32}$ and $112_{42}$ which are not participating in either of the first and second in-memory compute operations. FIG. 4A illustrates this mapping with an "X" indication on the local memory arrays 112 which are not being enabled and dashed boxes labeled IMC-OP1 and IMC-OP2 surrounding the local memory arrays 112 participating in the two independent and substantially simultaneous in-memory compute operations.

In this Example A, pulsed word line signals for the first in-memory compute operation (IMC-OP1) are generated by the row controller circuit 118 from the feature or coefficient data X and selectively applied, through the $WLD_1$ circuit in response to the row selection signal $RSel_1$, to the word lines WL of the local memory arrays $112_{11}$ and $112_{21}$ in the first array row (memory row sector). Additionally, pulsed word line signals for the first in-memory compute operation (IMC-OP1) are generated by the row controller circuit 118 and selectively applied, through the $WLD_2$ circuit in response to the row selection signal $RSel_2$, to the word lines WL of the local memory arrays $112_{12}$ and $112_{22}$ in the second array row (memory row sector). The analog signals $y_a$ on each local bit line LBL<a> for the local memory arrays $112_{11}$ and $112_{12}$ in the first array column (for the first memory column sector) are selectively applied, through the column decode circuits 200 in response to the column selection signals $CSel_{11}$ and $CSel_{12}$, to the global bit lines GBL<1> through GBL<f> to produce the analog signals $Y_1$ to $Y_f$. The analog signals $y_a$ on each local bit line LBL<a> for the local memory arrays $112_{21}$ and $112_{22}$ in the second array column (for the second memory column sector) are selectively applied, through the column decode circuits 200 in response to the column selection signals $CSel_{21}$ and $CSel_{22}$, to the global bit lines GBL<g> through GBL<h> to produce the analog signals $Y_g$ to $Y_h$. The analog signals $Y_1$ to $Y_h$ are indicative of the results of the matric vector multiplication for the first in-memory compute operation (IMC-OP1).

The column processing circuitry senses and samples the analog signals $Y_1$ to $Y_h$ on the global bit lines GBL<1> to GBL<h> for the matric vector multiplication and converts the analog signals to corresponding digital signals $dY_1$ to $dY_h$ using analog-to-digital converter circuitry. Digital computations and calculations on the digital signals $dY_1$ to $dY_h$ may be performed to generate a decision output for the first in-memory compute operation (IMC-OP1).

Additionally, pulsed word line signals for the second in-memory compute operation (IMC-OP2) are generated by the row controller circuit 118 from the feature or coefficient data X and selectively applied, through the $WLD_3$ circuit in response to the row selection signal $RSel_3$, to the word lines WL of the local memory arrays $112_{33}$ and $112_{43}$ in the third array row (memory row sector). Additionally, pulsed word line signals for the second in-memory compute operation (IMC-OP2) are generated by the row controller circuit 118 and selectively applied, through the $WLD_4$ circuit in response to the row selection signal $RSel_4$, to the word lines WL of the local memory arrays $112_{34}$ and $112_{44}$ in the fourth array row (memory row sector). The analog signals $y_a$ on each local bit line LBL<a> for the local memory arrays $112_{33}$ and $112_{34}$ in the third array column (for the third memory column sector) are selectively applied, through the column decode circuits 200 in response to the column selection signals $CSel_{33}$ and $CSel_{34}$, to the global bit lines GBL<s> through GBL<t> to produce the analog signals $Y_s$ to $Y_t$. The analog signals $y_a$ on each local bit line LBL<a> for the local memory arrays $112_{43}$ and $112_{44}$ in the fourth array column (for the fourth memory column sector) are selectively applied, through the column decode circuits 200 in response to the column selection signals $CSel_{43}$ and $CSel_{44}$, to the global bit lines GBL<u> through GBL<m> to produce the analog signals $Y_u$ to $Y_m$. The analog signals $Y_u$ to $Y_m$ are indicative of the results of the matric vector multiplication for the second in-memory compute operation (IMC-OP2).

The column processing circuitry senses and samples the analog signals $Y_s$ to $Y_m$ on the global bit lines GBL<s> to GBL<m> for the matric vector multiplication and converts the analog signals to corresponding digital signals $dY_s$ to $dY_m$ using analog-to-digital converter circuitry. Digital computations and calculations on the digital signals $dY_s$ to $dY_m$ may be performed to generate a decision output for the second in-memory compute operation (IMC-OP2).

Notably, the application of the pulsed word line signals for the first in-memory compute operation (IMC-OP1) by the $WLD_1$ and $WLD_2$ circuits can be made at least partially overlapping, preferably exactly simultaneously, with the application of the pulsed word line signals for the second in-memory compute operation (IMC-OP2) by the $WLD_3$ and $WLD_4$ circuits. The two in-memory compute operations are accordingly substantially simultaneously executed, and the results of those two in-memory compute operations are independently output through the analog signals $Y_1$ to $Y_h$ on the global bit lines GBL<1> to GBL<h> and the analog signals $Y_s$ to $Y_m$ on the global bit lines GBL<s> to GBL<m>, respectively.

Figure 4B:
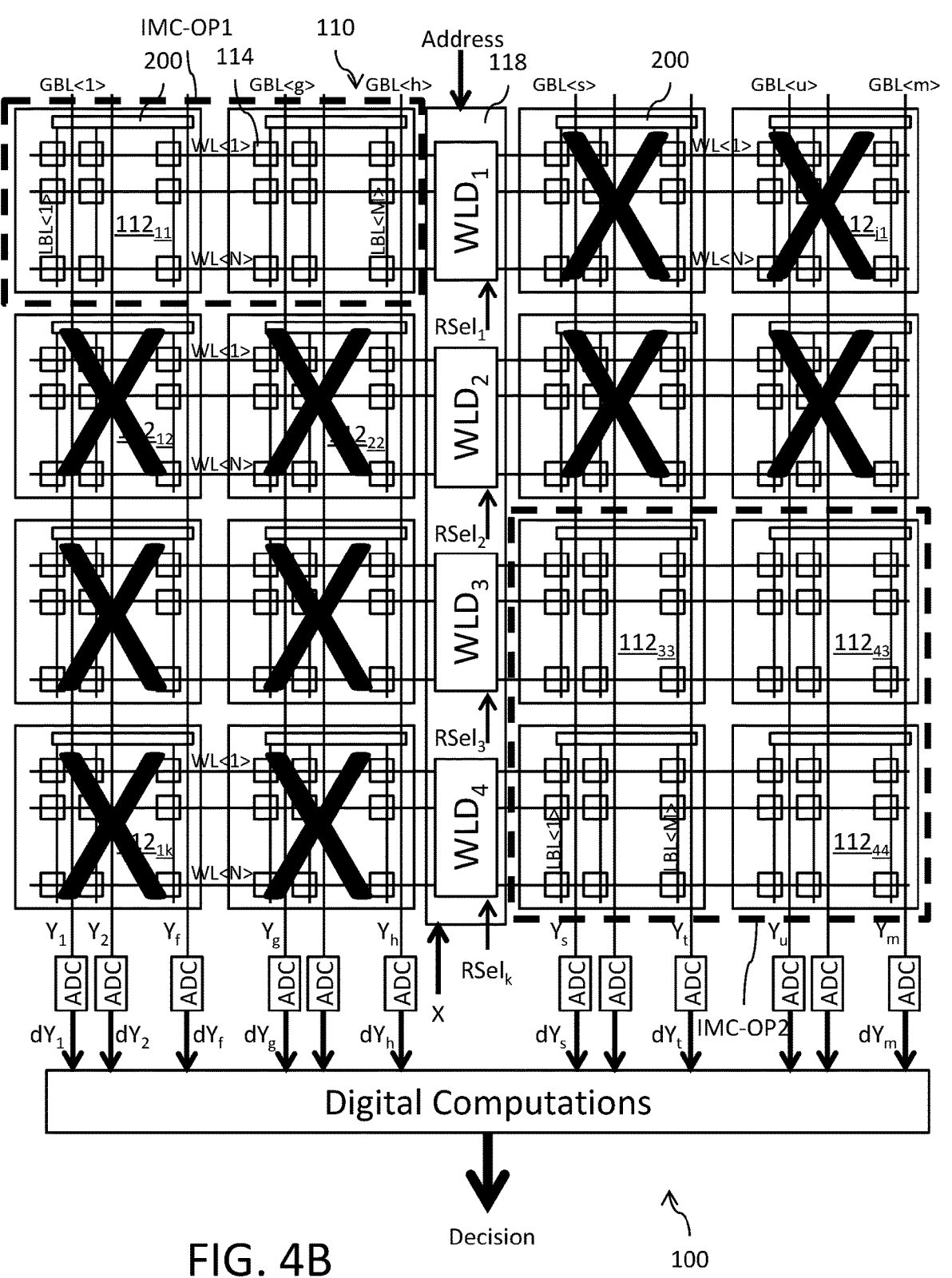

Example B: the column selection signals $CSel_{cd}$ and the row selection signals $RSel_d$ are generated to map local memory arrays $112_{11}$ and $112_{21}$ to a first in-memory compute operation (IMC-OP1) and map local memory arrays $112_{33}$, $112_{43}$, $112_{34}$ and $112_{44}$ to a second in-memory compute operation (IMC-OP2). This can be accomplished, for example: a) by asserting row selection signals $RSel_1$, $RSel_3$ and $RSel_4$, which will enable the $WLD_1$, $WLD_3$ and $WLD_4$ circuits, and deasserting selection signal $RSel_2$ which will disable the $WLD_2$ circuit; b) by asserting the column selection signals $CSel_{11}$ and $CSel_{21}$ which will enable the column decode circuits 200 for the local memory arrays $112_{11}$ and $112_{21}$ participating in the first in-memory compute operation (IMC-OP1) and asserting the column selection signals $CSel_{33}$, $CSel_{43}$, $CSel_{34}$ and $CSel_{44}$, which will enable the column decode circuits 200 for the local memory arrays $112_{33}$, $112_{43}$, $112_{34}$ and $112_{44}$ participating in the second in-memory compute operation (IMC-OP2); and c) by deasserting the column selection signals $CSel_{12}$, $CSel_{22}$, $CSel_{13}$, $CSel_{23}$, $CSel_{14}$, $CSel_{24}$, $CSel_{31}$, $CSel_{41}$, $CSel_{32}$ and $CSel_{42}$, which will disable the column decode circuits 200 for the local memory arrays $112_{12}$, $112_{22}$, $112_{13}$, $112_{23}$, $112_{14}$, $112_{24}$, $112_{31}$, $112_{41}$, $112_{32}$ and $112_{42}$ which are not participating in either of the first and second in-memory compute operations. FIG. 4B illustrates this mapping with an "X" indication on the local memory arrays 112 which are not being enabled and dashed boxes labeled IMC-OP1 and IMC-OP2 surrounding the local memory arrays 112 substantially simultaneously participating in the two independent in-memory compute operations.

In this Example B, pulsed word line signals for the first in-memory compute operation (IMC-OP1) are generated by the row controller circuit 118 from the feature or coefficient data X and selectively applied, through the $WLD_1$ circuit in response to the row selection signal $RSel_1$, to the word lines WL of the local memory arrays $112_{11}$ and $112_{21}$ in the first array row (memory row sector). The analog signals $y_a$ on each local bit line LBL<a> for the local memory array $112_{11}$ in the first array column (for the first memory column sector) are selectively applied, through the column decode circuits 200 in response to the column selection signal $CSel_{11}$, to the global bit lines GBL<1> through GBL<f> to produce the analog signals $Y_1$ to $Y_f$. The analog signals $y_a$ on each local bit line LBL<a> for the local memory array $112_{21}$ in the second array column (for the second memory column sector) are selectively applied, through the column decode circuits 200 in response to the column selection signal $CSel_{21}$, to the global bit lines GBL<g> through GBL<h> to produce the analog signals $Y_g$ to $Y_h$. The analog signals $Y_1$ to $Y_h$ are indicative of the results of the matric vector multiplication for the first in-memory compute operation (IMC-OP1).

The column processing circuitry senses and samples the analog signals $Y_1$ to $Y_h$ on the global bit lines GBL<1> to GBL<h> for the matric vector multiplication and converts the analog signals to corresponding digital signals $dY_1$ to $dY_h$ using analog-to-digital converter circuitry. Digital computations and calculations on the digital signals $dY_1$ to $dY_h$ may be performed to generate a decision output for the first in-memory compute operation (IMC-OP1).

Additionally, pulsed word line signals for the second in-memory compute operation (IMC-OP2) are generated by the row controller circuit 118 from the feature or coefficient data X and selectively applied, through the $WLD_3$ circuit in response to the row selection signal $RSel_3$, to the word lines WL of the local memory arrays $112_{33}$ and $112_{43}$ in the third array row (memory row sector). Additionally, pulsed word line signals for the second in-memory compute operation (IMC-OP2) are generated by the row controller circuit 118 and selectively applied, through the $WLD_4$ circuit in response to the row selection signal $RSel_4$, to the word lines WL of the local memory arrays $112_{34}$ and $112_{44}$ in the fourth array row (memory row sector). The analog signals $y_a$ on each local bit line LBL<a> for the local memory arrays $112_{33}$ and $112_{34}$ in the third array column (for the third memory column sector) are selectively applied, through the column decode circuits 200 in response to the column selection signals $CSel_{33}$ and $CSel_{34}$, to the global bit lines GBL<s> through GBL<t> to produce the analog signals $Y_s$ to $Y_t$. The analog signals $y_a$ on each local bit line LBL<a> for the local memory arrays $112_{43}$ and $112_{44}$ in the fourth array column (for the fourth memory column sector) are selectively applied, through the column decode circuits 200 in response to the column selection signals $CSel_{43}$ and $CSel_{44}$, to the global bit lines GBL<u> through GBL<m> to produce the analog signals $Y_u$ to $Y_m$. The analog signals $Y_s$ to $Y_m$ are indicative of the results of the matric vector multiplication for the second in-memory compute operation (IMC-OP2).

The column processing circuitry senses and samples the analog signals $Y_s$ to $Y_m$ on the global bit lines GBL<s> to GBL<m> for the matric vector multiplication and converts the analog signals to corresponding digital signals $dY_s$ to $dY_m$ using analog-to-digital converter circuitry. Digital computations and calculations on the digital signals $dY_s$ to $dY_m$ may be performed to generate a decision output for the second in-memory compute operation (IMC-OP2).

Notably, the application of the pulsed word line signals for the first in-memory compute operation (IMC-OP1) by the $WLD_1$ circuit can be made at least partially overlapping, preferably simultaneously, with the application of the pulsed word line signals for the second in-memory compute operation (IMC-OP2) by the $WLD_3$ and $WLD_4$ circuits. The two in-memory compute operations are accordingly substantially simultaneously executed, and the results of those two in-memory compute operations are independently output through the analog signals $Y_1$ to $Y_h$ on the global bit lines GBL<1> to GBL<h> and the analog signals $Y_s$ to $Y_m$ on the global bit lines GBL<s> to GBL<m>, respectively.

Figure 4C:
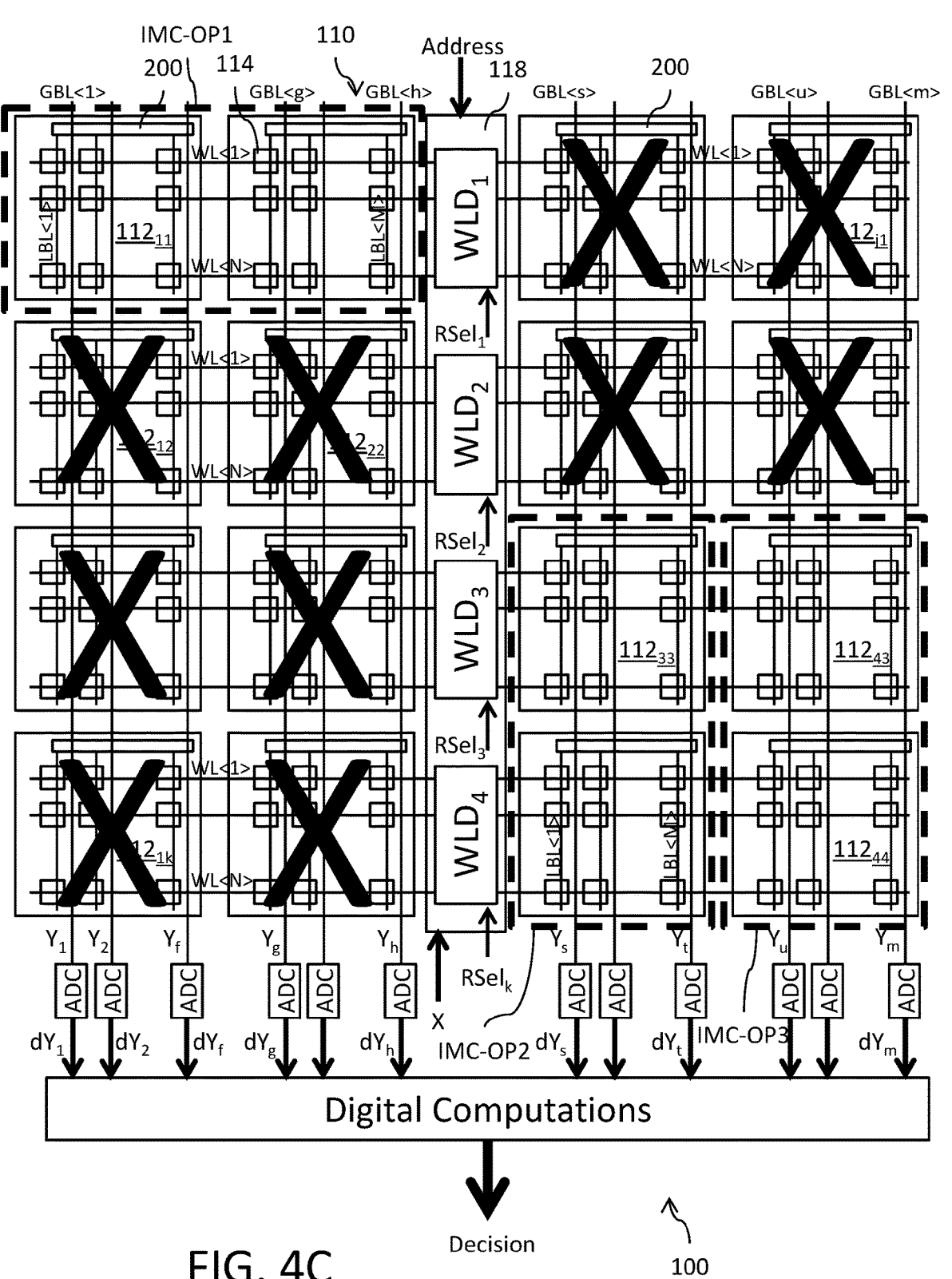

Example C: the column selection signals $CSel_{cd}$ and the row selection signals $RSel_d$ are generated to map local memory arrays $112_{11}$ and $112_{21}$ to a first in-memory compute operation (IMC-OP1), map local memory arrays $112_{33}$ and $112_{34}$ to a second in-memory compute operation (IMC-OP2), and map local memory arrays $112_{43}$ and $112_{44}$ to a third in-memory compute operation (IMC-OP3). This can be accomplished, for example: a) by asserting row selection signals $RSel_1$, $RSel_3$ and $RSel_4$, which will enable the $WLD_1$, $WLD_3$ and $WLD_4$ circuits, and deasserting selection signal $RSel_2$ which will disable the $WLD_2$ circuit; b) by asserting the column selection signals $CSel_{11}$ and $CSel_{21}$ which will enable the column decode circuits 200 for the local memory arrays $112_{11}$ and $112_{21}$ participating in the first in-memory compute operation (IMC-OP1), asserting the column selection signals $CSe_{33}$ and $CSel_{34}$ which will enable the column decode circuits 200 for the local memory arrays $112_{33}$ and $112_{34}$ participating in the second in-memory compute operation (IMC-OP2), and asserting the column selection signals $CSel_{43}$ and $CSel_{44}$ which will enable the column decode circuits 200 for the local memory arrays $112_{43}$ and $112_{44}$ participating in the third in-memory compute operation (IMC-OP3); and c) by deasserting the column selection signals $CSel_{12}$, $CSel_{22}$, $CSel_{13}$, $CSel_{23}$, $CSel_{14}$, $CSel_{24}$, $CSel_{31}$, $CSel_{41}$, $CSel_{32}$ and $CSel_{42}$, which will disable the column decode circuits 200 for the local memory arrays $112_{12}$, $112_{22}$, $112_{13}$, $112_{23}$, $112_{14}$, $112_{24}$, $112_{31}$, $112_{41}$, $112_{32}$ and $112_{42}$ which are not participating in any of the first, second and third in-memory compute operations. FIG. 4C illustrates this mapping with an "X" indication on the local memory arrays 112 which are not being enabled and dashed boxes labeled IMC-OP1, IMC-OP2 and IMC-OP3 surrounding the local memory arrays 112 substantially simultaneously participating in the three independent in-memory compute operations.

In this Example C, pulsed word line signals for the first in-memory compute operation (IMC-OP1) are generated by the row controller circuit 118 from the feature or coefficient data X and selectively applied, through the $WLD_1$ circuit in response to the row selection signal $RSel_1$, to the word lines WL of the local memory arrays $112_{11}$ and $112_{21}$ in the first array row (memory row sector). The analog signals $y_a$ on each local bit line LBL<a> for the local memory array $112_{11}$ in the first array column (for the first memory column sector) are selectively applied, through the column decode circuits 200 in response to the column selection signal $CSel_{11}$, to the global bit lines GBL<1> through GBL<f> to produce the analog signals $Y_1$ to $Y_f$. The analog signals $y_a$ on each local bit line LBL<a> for the local memory array $112_{21}$ in the second array column (for the second memory column sector) are selectively applied, through the column decode circuits 200 in response to the column selection signal $CSel_{21}$, to the global bit lines GBL<g> through GBL<h> to produce the analog signals $Y_g$ to $Y_h$. The analog signals $Y_1$ to $Y_h$ are indicative of the results of the matric vector multiplication for the first in-memory compute operation (IMC-OP1).

The column processing circuitry senses and samples the analog signals $Y_1$ to $Y_h$ on the global bit lines GBL<1> to GBL<h> for the matric vector multiplication and converts the analog signals to corresponding digital signals $dY_1$ to $dY_h$ using analog-to-digital converter circuitry. Digital computations and calculations on the digital signals $dY_1$ to $dY_h$ may be performed to generate a decision output for the first in-memory compute operation (IMC-OP1).

Additionally, pulsed word line signals for the second and third in-memory compute operations (IMC-OP2 and IMC-OP3) are generated by the row controller circuit 118 from the feature or coefficient data X and selectively applied, through the $WLD_3$ circuit in response to the row selection signal $RSel_3$, to the word lines WL of the local memory arrays $112_{33}$ and $112_{43}$ in the third array row (memory row sector). Additionally, pulsed word line signals for the second and third in-memory compute operations (IMC-OP2 and IMC-OP3) are generated by the row controller circuit 118 and selectively applied, through the $WLD_4$ circuit in response to the row selection signal $RSel_4$, to the word lines WL of the local memory arrays $112_{34}$ and $112_{44}$ in the fourth array row (memory row sector). The analog signals $y_a$ on each local bit line LBL<a> for the local memory arrays $112_{33}$ and $112_{34}$ in the third array column (for the third memory column sector) are selectively applied, through the column decode circuits 200 in response to the column selection signals $CSel_{33}$ and $CSel_{34}$, to the global bit lines GBL<s> through GBL<t> to produce the analog signals $Y_s$ to $Y_t$. The analog signals $Y_s$ to $Y_t$ are indicative of the results of the matric vector multiplication for the second in-memory compute operation (IMC-OP2). The analog signals $y_a$ on each local bit line LBL<a> for the local memory arrays $112_{43}$ and $112_{44}$ in the fourth array column (for the fourth memory column sector) are selectively applied, through the column decode circuits 200 in response to the column selection signals $CSel_{43}$ and $CSel_{44}$, to the global bit lines GBL<u> through GBL<m> to produce the analog signals $Y_u$ to $Y_m$. The analog signals $Y_u$ to $Y_m$ are indicative of the results of the matric vector multiplication for the third in-memory compute operation (IMC-OP3).

The column processing circuitry senses and samples the analog signals $Y_s$ to $Y_t$ on the global bit lines GBL<s> to GBL<t> for the matric vector multiplication and converts the analog signals to corresponding digital signals $dY_s$ to $dY_t$ using analog-to-digital converter circuitry. Digital computations and calculations on the digital signals $dY_s$ to $dY_t$ may be performed to generate a decision output for the second in-memory compute operation (IMC-OP2). Similarly, the column processing circuitry senses and samples the analog signals $Y_u$ to $Y_m$ on the global bit lines GBL<u> to GBL<m> for the matric vector multiplication and converts the analog signals to corresponding digital signals $dY_u$ to $dY_m$ using analog-to-digital converter circuitry. Digital computations and calculations on the digital signals $dY_u$ to $dY_m$ may be performed to generate a decision output for the third in-memory compute operation (IMC-OP3).

Notably, the application of the pulsed word line signals for the first in-memory compute operation (IMC-OP1) by the $WLD_1$ and $WLD_2$ circuits can be made at least partially overlapping, preferably simultaneously, with the application of the pulsed word line signals for the second and third in-memory compute operations (IMC-OP2 and IMC-OP3) by the $WLD_3$ and $WLD_4$ circuits. The three in-memory compute operations are accordingly substantially simultaneously executed, and the results of those three in-memory compute operations are independently output through the analog signals $Y_1$ to $Y_h$ on the global bit lines GBL<1> to GBL<h>, the analog signals $Y_s$ to $Y_t$ on the global bit lines GBL<s> to GBL<t>, and the analog signals $Y_u$ to $Y_m$ on the global bit lines GBL<u> to GBL<m>, respectively.

Figure 4D:
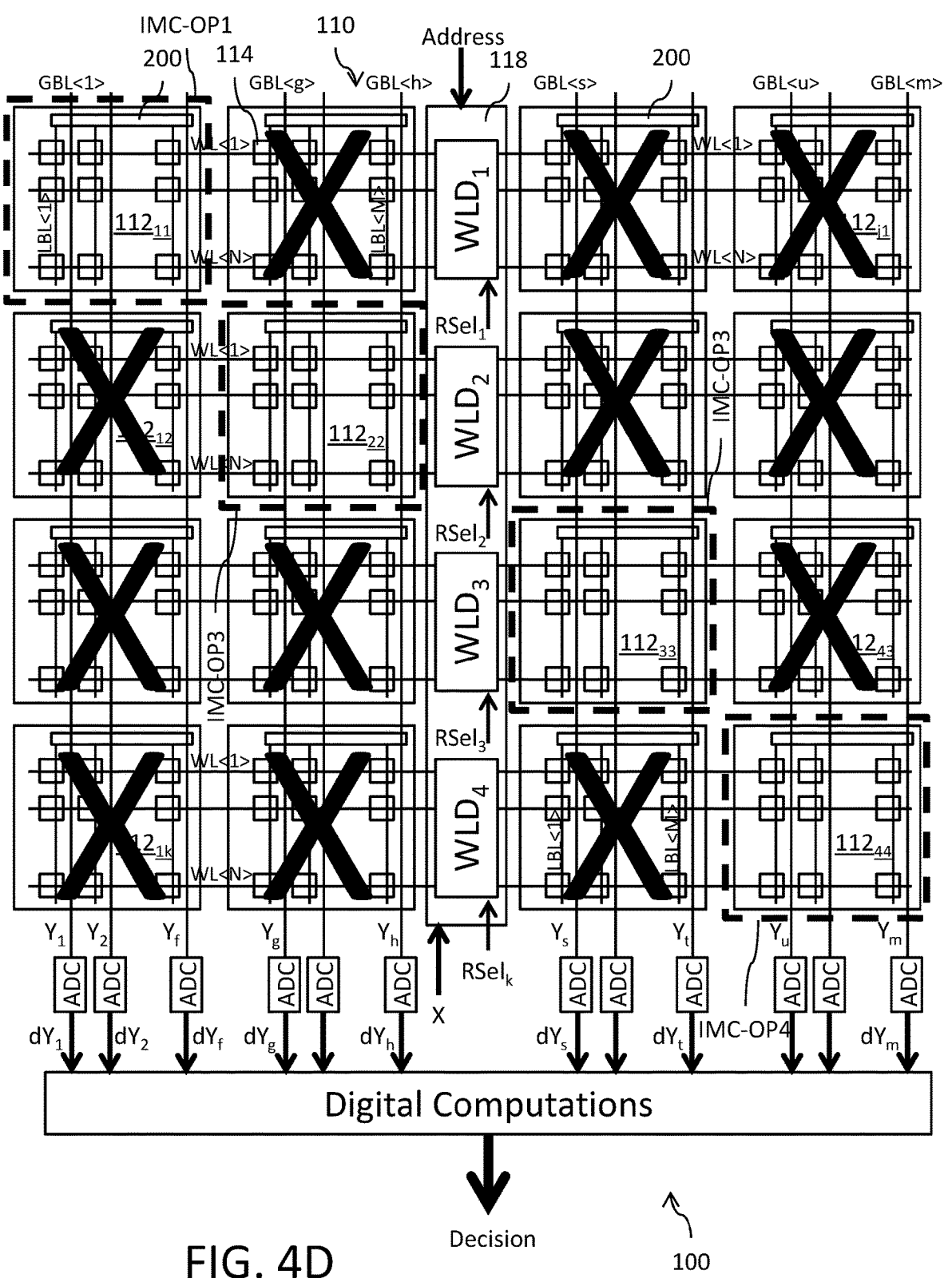

Example D: the column selection signals $CSel_{cd}$ and the row selection signals $RSel_d$ are generated to map local memory array $112_{11}$ to a first in-memory compute operation (IMC-OP1), map local memory array $112_{22}$ to a second in-memory compute operation (IMC-OP2), map local memory array $112_{33}$ to a third in-memory compute operation (IMC-OP3), and map local memory array $112_{44}$ to a fourth in-memory compute operation (IMC-OP4). This can be accomplished, for example: a) by asserting row selection signals $RSel_1$, $RSel_2$, $RSel_3$ and $RSel_4$, which will enable the $WLD_1$, $WLD_2$, $WLD_3$ and $WLD_4$ circuits; b) by asserting the column selection signal $CSel_{11}$ which will enable the column decode circuit 200 for the local memory array $112_{11}$ participating in the first in-memory compute operation (IMC-OP1), asserting the column selection signal $CSel_{22}$ which will enable the column decode circuit 200 for the local memory array $112_{22}$ participating in the second in-memory compute operation (IMC-OP2), asserting the column selection signal $CSel_{33}$ which will enable the column decode circuit 200 for the local memory array $112_{33}$ participating in the third in-memory compute operation (IMC-OP3), and asserting the column selection signal $CSel_{44}$ which will enable the column decode circuits 200 for the local memory array $112_{44}$ participating in the fourth in-memory compute operation (IMC-OP4); and c) by deasserting the column selection signals $CSel_{21}$, $CSel_{31}$, $CSel_{41}$, $CSel_{12}$, $CSel_{14}$, $CSel_{32}$, $CSe_{142}$, $CSel_{13}$, $CSel_{23}$, $CSel_{43}$, $CSel_{14}$, $CSel_{24}$ and $CSel_{34}$ which will disable the column decode circuits 200 for the local memory arrays $112_{21}$, $112_{22}$, $112_{23}$, $112_{12}$, $112_{32}$, $112_{42}$, $112_{13}$, $112_{23}$, $112_{43}$, $112_{14}$, $112_{24}$ and $112_{34}$ which are not participating in any of the first, second, third and fourth in-memory compute operations. FIG. 4D illustrates this mapping with an "X" indication on the local memory arrays 112 which are not being enabled and dashed boxes labeled IMC-OP1, IMC-OP2, IMC-OP3 and IMC-OP4 surrounding the local memory arrays 112 substantially simultaneously participating in the four independent in-memory compute operations.

In this Example D, pulsed word line signals for the first in-memory compute operation (IMC-OP1) are generated by the row controller circuit 118 from the feature or coefficient data X and selectively applied, through the $WLD_1$ circuit in response to the row selection signal $RSel_1$, to the word lines WL of the local memory array $112_{11}$ in the first array row (memory row sector). The analog signals $y_a$ on each local bit line LBL<a> for the local memory array $112_{11}$ in the first array column (for the first memory column sector) are selectively applied, through the column decode circuit 200 in response to the column selection signal $CSel_{11}$, to the global bit lines GBL<1> through GBL<f> to produce the analog signals $Y_1$ to $Y_f$. The analog signals $Y_1$ to $Y_f$ are indicative of the results of the matric vector multiplication for the first in-memory compute operation (IMC-OP1).

The column processing circuitry senses and samples the analog signals $Y_1$ to $Y_f$ on the global bit lines GBL<1> to GBL<f> for the matric vector multiplication and converts the analog signals to corresponding digital signals $dY_1$ to $dY_f$ using analog-to-digital converter circuitry. Digital computations and calculations on the digital signals $dY_1$ to $dY_f$ may be performed to generate a decision output for the first in-memory compute operation (IMC-OP1).

Additionally, pulsed word line signals for the second in-memory compute operation (IMC-OP2) are generated by the row controller circuit 118 from the feature or coefficient data X and selectively applied, through the $WLD_2$ circuit in response to the row selection signal $RSel_2$, to the word lines WL of the local memory array $112_{22}$ in the second array row (memory row sector) The analog signals $y_a$ on each local bit line LBL<a> for the local memory array $112_{22}$ in the second array column (for the second memory column sector) are selectively applied, through the column decode circuit 200 in response to the column selection signal $CSel_{22}$, to the global bit lines GBL<g> through GBL<h> to produce the analog signals $Y_g$ to $Y_h$. The analog signals $Y_g$ to $Y_h$ are indicative of the results of the matric vector multiplication for the second in-memory compute operation (IMC-OP2).

The column processing circuitry senses and samples the analog signals $Y_g$ to $Y_h$ on the global bit lines GBL<g> to GBL<h> for the matric vector multiplication and converts the analog signals to corresponding digital signals $dY_g$ to $dY_h$ using analog-to-digital converter circuitry. Digital computations and calculations on the digital signals $dY_g$ to $dY_h$ may be performed to generate a decision output for the second in-memory compute operation (IMC-OP2).

Still further, pulsed word line signals for the third in-memory compute operation (IMC-OP3) are generated by the row controller circuit 118 from the feature or coefficient data X and selectively applied, through the $WLD_3$ circuit in response to the row selection signal $RSel_3$, to the word lines WL of the local memory array $112_{33}$ in the third array row (memory row sector). The analog signals $y_a$ on each local bit line LBL<a> for the local memory array $112_{33}$ in the third array column (for the third memory column sector) are selectively applied, through the column decode circuit 200 in response to the column selection signal $CSel_{33}$, to the global bit lines GBL<s> through GBL<t> to produce the analog signals $Y_s$ to $Y_t$. The analog signals $Y_s$ to $Y_t$ are indicative of the results of the matric vector multiplication for the third in-memory compute operation (IMC-OP3).

The column processing circuitry senses and samples the analog signals $Y_s$ to $Y_t$ on the global bit lines GBL<s> to GBL<t> for the matric vector multiplication and converts the analog signals to corresponding digital signals $dY_s$ to $dY_t$ using analog-to-digital converter circuitry. Digital computations and calculations on the digital signals $dY_s$ to $dY_t$ may be performed to generate a decision output for the third in-memory compute operation (IMC-OP3).

Lastly, pulsed word line signals for the fourth in-memory compute operation (IMC-OP4) are generated by the row controller circuit 118 from the feature or coefficient data X and selectively applied, through the $WLD_4$ circuit in response to the row selection signal $RSel_4$, to the word lines WL of the local memory array $112_{44}$ in the fourth array row (memory row sector). The analog signals $y_a$ on each local bit line LBL<a> for the local memory array $112_{44}$ in the fourth array column (for the fourth memory column sector) are selectively applied, through the column decode circuit 200 in response to the column selection signal $CSel_{44}$, to the global bit lines GBL<u> through GBL<m> to produce the analog signals $Y_u$ to $Y_m$. The analog signals $Y_u$ to $Y_m$ are indicative of the results of the matric vector multiplication for the fourth in-memory compute operation (IMC-OP4).

The column processing circuitry senses and samples the analog signals $Y_u$ to $Y_m$ on the global bit lines GBL<u> to GBL<m> for the matric vector multiplication and converts the analog signals to corresponding digital signals $dY_u$ to $dY_m$ using analog-to-digital converter circuitry. Digital computations and calculations on the digital signals $dY_u$ to $dY_m$ may be performed to generate a decision output for the fourth in-memory compute operation (IMC-OP4).

Notably, there is at least partially overlapping, preferably simultaneous, application of the pulsed word line signals for the first in-memory compute operation (IMC-OP1) by the $WLD_1$ circuit, the pulsed word line signals for the second in-memory compute operation (IMC-OP2) by the $WLD_2$ circuit, the pulsed word line signals for the third in-memory compute operation (IMC-OP3) by the $WLD_3$ circuit, and the pulsed word line signals for the fourth in-memory compute operation (IMC-OP4) by the $WLD_4$ circuit. The four in-memory compute operations are accordingly substantially simultaneously executed, and the results of those four in-memory compute operations are independently output through the analog signals $Y_1$ to $Y_f$ on the global bit lines GBL<1> to GBL<f>, the analog signals $Y_g$ to $Y_h$ on the global bit lines GBL<g> to GBL<h>, the analog signals $Y_s$ to $Y_t$ on the global bit lines GBL<s> to GBL<t>, and the analog signals $Y_u$ to $Y_m$ on the global bit lines GBL<u> to GBL<m>, respectively.

The flexibility of the system to substantially simultaneously handle multiple in-memory compute operations of selected size (using different numbers of local memory array 112) is well illustrated by the examples of FIGS. 4A-4D. The illustrated examples of FIGS. 4A-4D are not to be considered limiting. Indeed, the user may, through selective assertion/deassertion of the column selection signals $CSel_{cd}$ and the row selection signals $RSel_d$, configure a number of different arrangements for effectively handling a plurality of simultaneous and independent in-memory compute operations.

With reference once again to FIGS. 2 and 3, an even smaller mapping of independent in-memory compute operations can be effectuated by splitting word line drive control in each array row (memory row sector). This is designated by the dotted line in FIG. 3 dividing each $WLD_d$ circuit to distinguish an upper circuit half and a lower circuit half. The row selection signals $RSel_d$ can be implemented using, for example, two bits control whether all word lines WL for the array row (sector) are enabled through both the upper and lower circuit halves, only the upper half of the word lines WL associated with the upper circuit half of the $WLD_d$ circuit are enabled, or only the lower half of the word lines WL associated with the lower circuit half of the $WLD_d$ circuit are enabled.

Figure 5A:
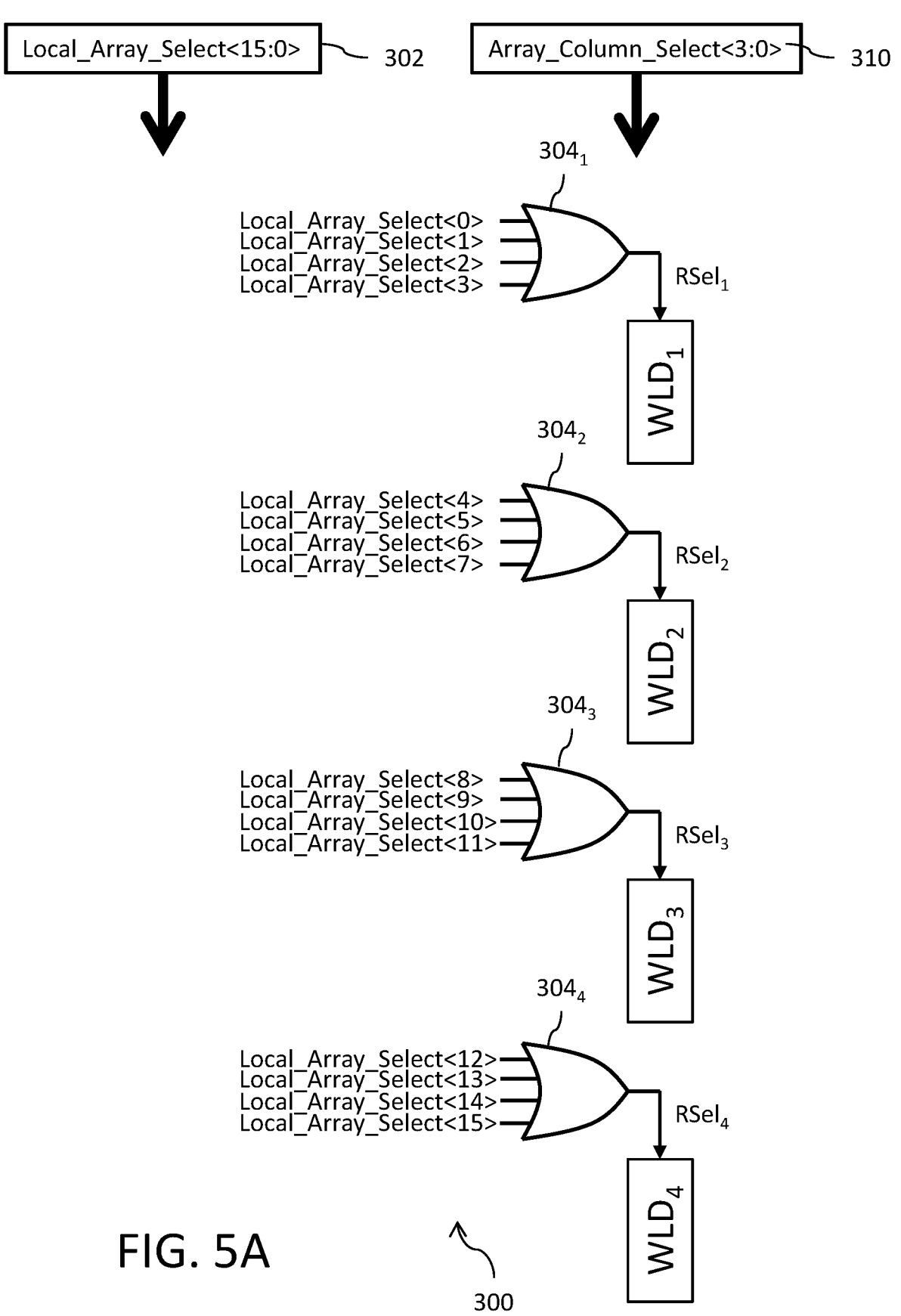
FIGS. 5A-5D show a diagram for a control circuit used with the circuit of FIG. 2.
Figure 5B:
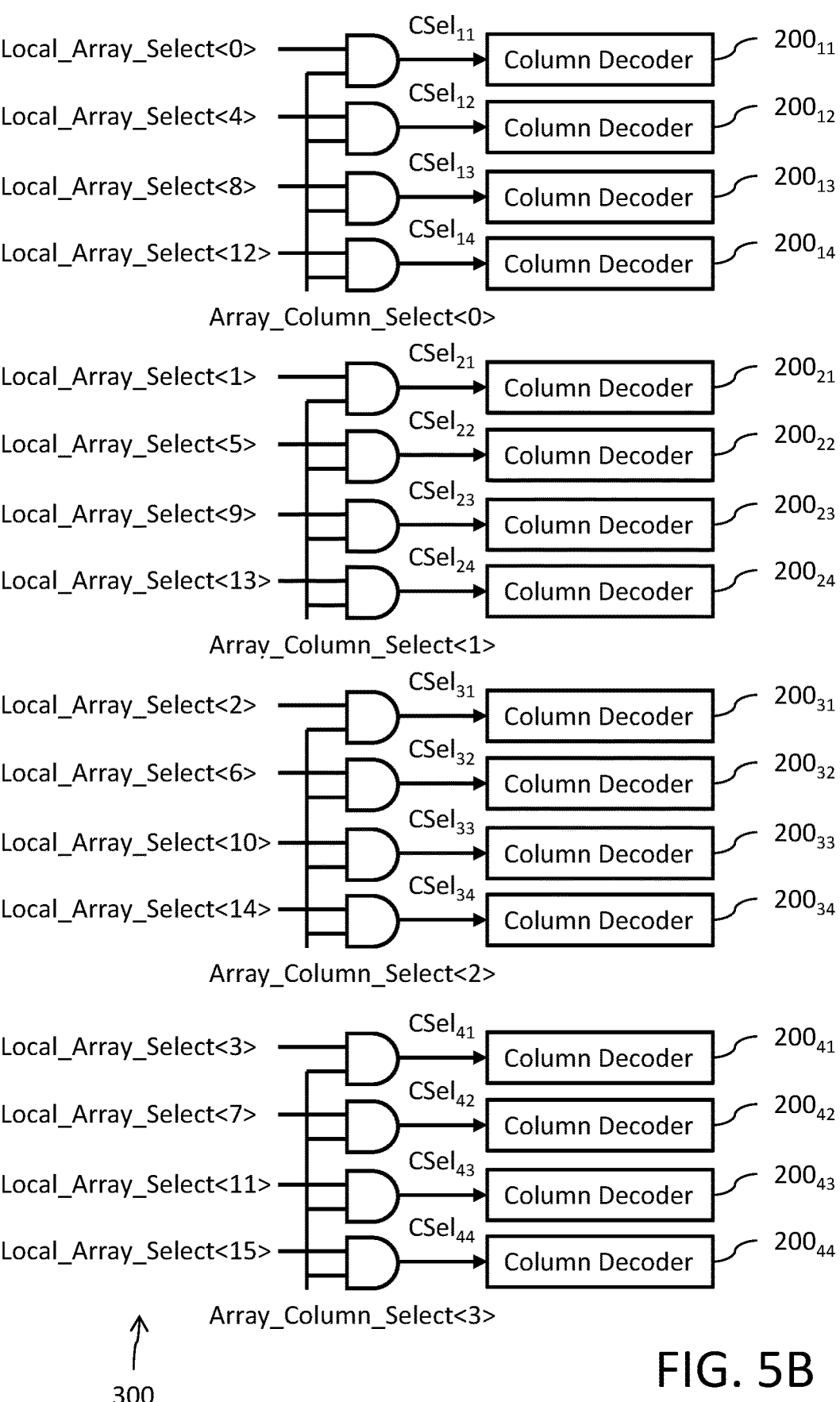

Reference is now made to FIGS. 5A-5B which show an example for control circuitry for generating the row selection signals $RSel_d$ and column selection signals $CSel_{cd}$. FIGS. 5A and 5B assume, for example only, the configuration of the memory 110 shown with the examples of FIGS. 2 and 4A-4D, where there are four array rows in the matrix of local memory array 112 with a corresponding four $WLD_1$, $WLD_2$ $WLD_3$ and $WLD_4$ circuits, four array rows (memory row sectors), four array columns (memory column sectors), and sixteen local memory arrays $112_{11}$, . . . , $112_{44}$.

A data register 302 stores the data bits of a local array select signal (Local_Array_Select<15:0>). In this example, there are sixteen bits in the signal, with the logic state of each bit being indicative of whether the local memory array 112 corresponding to that bit is participating in any of the in-memory compute operations. For example, if the bit is logic "1", then the corresponding the local memory array 112 is participating. The enable input of each WLD circuit is coupled to receive the row selection signal RSel which is generated by logically combining certain bits of the local array select signal.

A first logical OR gate $304_1$ has inputs coupled to receive the bits <0>, <1>, <2> and <3> assigned to the local memory arrays $112_{11}$, $112_{21}$, $112_{31}$ and $112_{41}$, respectively of the first array row of the memory 110. An output of the gate $304_1$ generates the row selection signal $RSel_1$. If any of the bits <0>, <1>, <2> and <3> is logic "1" because any of the local memory arrays $112_{11}$, $112_{21}$, $112_{31}$ and $112_{41}$ are participating in an in-memory compute operation, then the row selection signal $RSel_1$ is asserted and the $WLD_1$ circuit is enabled.

A second logical OR gate $304_2$ has inputs coupled to receive the bits <4>, <5>, <6> and <7> assigned to the local memory arrays $112_{12}$, $112_{22}$, $112_{32}$ and $112_{42}$, respectively of the second array row of the memory 110. An output of the gate $304_2$ generates the row selection signal $RSel_2$. If any of the bits <4>, <5>, <6> and <7> is logic "1" because any of the local memory arrays $112_{12}$, $112_{22}$, $112_{32}$ and $112_{42}$ are participating in an in-memory compute operation, then the row selection signal $RSel_2$ is asserted and the $WLD_2$ circuit is enabled.

A third logical OR gate $304_3$ has inputs coupled to receive the bits <8>, <9>, <10> and <11> assigned to the local memory arrays $112_{13}$, $112_{23}$, $112_{33}$ and $112_{43}$, respectively of the third array row of the memory 110. An output of the gate $304_3$ generates the row selection signal $RSel_3$. If any of the bits <8>, <9>, <10> and <11> is logic "1" because any of the local memory arrays $112_{13}$, $112_{23}$, $112_{33}$ and $112_{43}$ are participating in an in-memory compute operation, then the row selection signal $RSel_3$ is asserted and the $WLD_3$ circuit is enabled.

A fourth logical OR gate $304_4$ has inputs coupled to receive the bits <12>, <13>, <14> and <15> assigned to the local memory arrays $112_{14}$, $112_{24}$, $112_{34}$ and $112_{44}$, respectively of the third array row of the memory 110. An output of the gate $304_4$ generates the row selection signal $RSel_4$. If any of the bits <12>, <13>, <14> and <15> is logic "1" because any of the local memory arrays $112_{14}$, $112_{24}$, $112_{34}$ and $112_{44}$ are participating in an in-memory compute operation, then the row selection signal $RSel_4$ is asserted and the $WLD_4$ circuit is enabled.

A data register 310 stores the data bits of an array column select signal (Array_Column_Select<3:0>). In this example, there are three bits in the signal, with the logic state of each bit being indicative of whether the array column (the memory array sector) corresponding to that bit has local memory arrays 112 participating in any of the in-memory compute operations. For example, if the bit is logic "1", then the corresponding array column has one or more local memory arrays 112 participating. The enable input of each column decoder circuit 200 of a local memory array is coupled to receive the column selection signal CSel which is generated by logically combining certain bits of the local array select signal and the array column select signal.

For the column decoders $200_{11}$, $200_{12}$, $200_{13}$ and $200_{14}$ associated with the local memory arrays $112_{11}$, $112_{12}$, $112_{13}$ and $112_{14}$ in the first column of the memory 110, logical AND gates logically combine bit <0> of the array column select signal with each of bits <0>, <4>, <8> and <12> of the local array select signal. The logical AND gates generate column selection signals $CSel_{11}$, $CSel_{12}$, $CSel_{13}$ and $CSel_{14}$ for selectively enabling the column decoders $200_{11}$, $200_{12}$, $200_{13}$ and $200_{14}$. A logic "1" state for the bit <0> of the array column select signal indicates that at least one of the local memory arrays $112_{11}$, $112_{12}$, $112_{13}$ and $112_{14}$ is participating in the in-memory compute operations and a logic "1" state for any of the bits <0>, <4>, <8> and <12> of the local array select signal specifies which particular one or ones of the local memory arrays $112_{11}$, $112_{12}$, $112_{13}$ and $112_{14}$ is participating. If both bits input to the AND gate are logic "1", then the corresponding column decoder 200 is enabled to connect the local bit lines LBL of the local memory array 112 to the corresponding global bit lines GBL<1> to GBL<f>.

For the column decoders $200_{21}$, $200_{22}$, $200_{23}$ and $200_{24}$ associated with the local memory arrays $112_{21}$, $112_{22}$, $112_{23}$ and $112_{24}$ in the second column of the memory 110, logical AND gates logically combine bit <1> of the array column select signal with each of bits <1>, <5>, <9> and <13> of the local array select signal. The logical AND gates generate column selection signals $CSel_{21}$, $CSel_{22}$, $CSel_{23}$ and $CSel_{24}$ for selectively enabling the column decoders $200_{21}$, $200_{22}$, $200_{23}$ and $200_{24}$. A logic "1" state for the bit <0> of the array column select signal indicates that at least one of the local memory arrays $112_{21}$, $112_{22}$, $112_{23}$ and $112_{24}$ is participating in the in-memory compute operations and a logic "1" state for any of the bits <1>, <5>, <9> and <13> of the local array select signal specifies which particular one or ones of the local memory arrays $112_{21}$, $112_{22}$, $112_{23}$ and $112_{24}$ is participating. If both bits input to the AND gate are logic "1", then the corresponding column decoder 200 is enabled to connect the local bit lines LBL of the local memory array 112 to the corresponding global bit lines GBL<g> to GBL<h>.

For the column decoders $200_{31}$, $200_{32}$, $200_{33}$ and $200_{34}$ associated with the local memory arrays $112_{31}$, $112_{32}$, $112_{33}$ and $112_{34}$ in the third column of the memory 110, logical AND gates logically combine bit <2> of the array column select signal with each of bits <2>, <6>, <10> and <14> of the local array select signal. The logical AND gates generate column selection signals $CSel_{31}$, $CSel_{32}$, $CSel_{33}$ and $CSel_{34}$ for selectively enabling the column decoders $200_{31}$, $200_{32}$, $200_{33}$ and $200_{34}$. A logic "1" state for the bit <0> of the array column select signal indicates that at least one of the local memory arrays $112_{31}$, $112_{32}$, $112_{33}$ and $112_{34}$ is participating in the in-memory compute operations and a logic "1" state for any of the bits <2>, <6>, <10> and <14> of the local array select signal specifies which particular one or ones of the local memory arrays $112_{31}$, $112_{32}$, $112_{33}$ and $112_{34}$ is participating. If both bits input to the AND gate are logic "1", then the corresponding column decoder 200 is enabled to connect the local bit lines LBL of the local memory array 112 to the corresponding global bit lines GBL<s> to GBL<t>.

For the column decoders $200_{41}$, $200_{42}$, $200_{43}$ and $200_{44}$ associated with the local memory arrays $112_{41}$, $112_{42}$, $112_{43}$ and $112_{44}$ in the third column of the memory 110, logical AND gates logically combine bit <3> of the array column select signal with each of bits <3>, <7>, <11> and <15> of the local array select signal. The logical AND gates generate column selection signals $CSel_{41}$, $CSel_{42}$, $CSel_{43}$ and $CSel_{44}$ for selectively enabling the column decoders $200_{41}$, $200_{42}$, $200_{43}$ and $200_{44}$. A logic "1" state for the bit <0> of the array column select signal indicates that at least one of the local memory arrays $112_{41}$, $112_{42}$, $112_{43}$ and $112_{44}$ is participating in the in-memory compute operations and a logic "1" state for any of the bits <3>, <7>, <11> and <15> of the local array select signal specifies which particular one or ones of the local memory arrays $112_{41}$, $112_{42}$, $112_{43}$ and $112_{44}$ is participating. If both bits input to the AND gate are logic "1", then the corresponding column decoder 200 is enabled to connect the local bit lines LBL of the local memory array 112 to the corresponding global bit lines GBL<u> to GBL<m>.

Figure 5C:
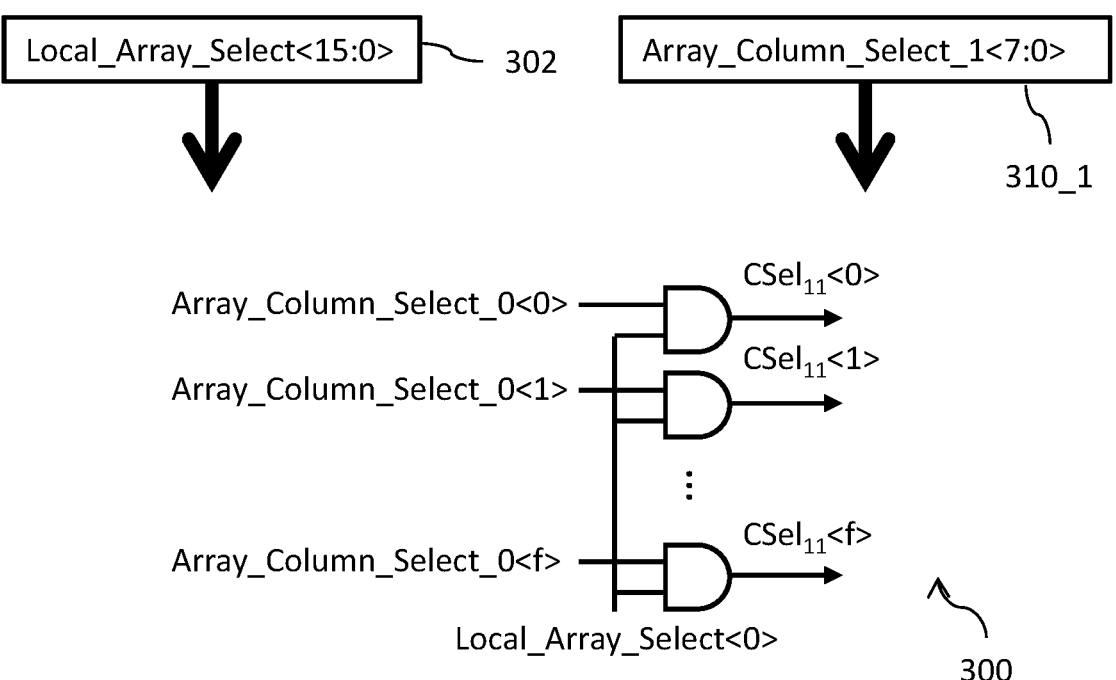
Figure 5C:
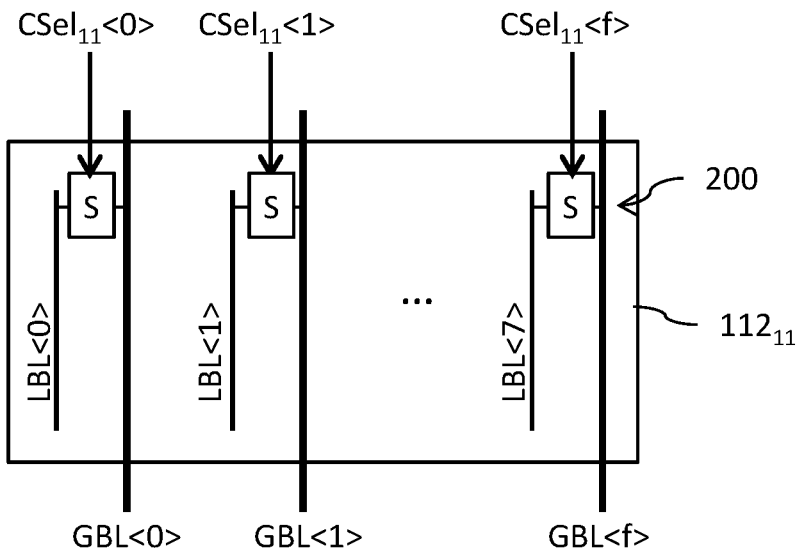

It is further possible to exercise a higher degree of selectivity (granularity) in the column decoder 200 for connecting local bit lines LBL to global bit lines GBL. Instead of the column selection signal CSel being a single bit which would control the connection by the column decoder 200 of all of the local bit lines LBL to the corresponding global bit lines GBL, the column selection signal CSel may instead be implemented as a multi-bit signal, with each individual bit of that column selection signal CSel controlling the connection by the column decoder 200 of one local bit line LBL to its corresponding global bit line. An implementation of the control circuit 300 for supporting this operation is shown in FIG. 5C with respect to a single one of the local memory arrays $112_{11}$, it being understood that this circuit would be replicated with respect to each local memory array.

Consider here an example with the local memory array $112_{11}$ including eight local bit lines LBL<0> to LBL<7>. The column decoder 200 can be controlled by the multi-bit column selection signal $CSel_{11}$<f:0> to individually (and selectively) connect each local bit line to a corresponding global bit line GBL<0> to GBL<f>. The selective connection between a local bit line and its associated global bit line can be made, for example, through the use of a transistor switch (S) actuated by a corresponding bit of the column selection signal CSel.

A data register 310_c, where the value of c indicates the array column of the memory 110, stores the data bits of an array column select signal (Array_Column_Select_c<7:0>). In this example, there are eight bits in the signal, with the logic state of each bit being indicative of whether a corresponding local bit line LBL in the local memory array 112 is participating in any of the in-memory compute operations and is to be connected to the corresponding global bit line GBL. For example, if the bit <0> of the array column select signal for local memory array $112_{11}$ is logic "1", then the local bit line LBL<0> is to be connected to the corresponding global bit line GBL<0> for the in-memory compute operation. When the local memory array $112_{11}$ is selected for the in-memory compute operation through bit <0> of the local array select signal, the logical combination of that bit with the bit <0> of the array column select signal will cause an assertion of the column selection signal $CSel_{11}$<0> to actuation the switch (S) and connect local bit line LBL<0> to the corresponding global bit line GBL<0>.

The control circuit 300 includes, for each local memory array $112_{cd}$, a plurality of logical AND gates, with one gate per local bit line LBL of the local memory array 112, where the AND gates logically combine the bit of the local array select signal for that local memory array 112 with the bits of the array column select signal to generate the corresponding bits of the column selection signal CSel for individually controlling the switches (S) to selectively connect local bit lines LBL to corresponding global bit lines GBL.

The logic circuits shown in FIG. 5C are replicated in the control circuit 300 for each local memory array $112_{cd}$. However, there will be a different data register 310_c storing the data bits of then array column select signal (Array_Column_Select_c<7:0>) for each array column (memory column sector) of the local memory array $112_{cd}$.

Figure 5D:
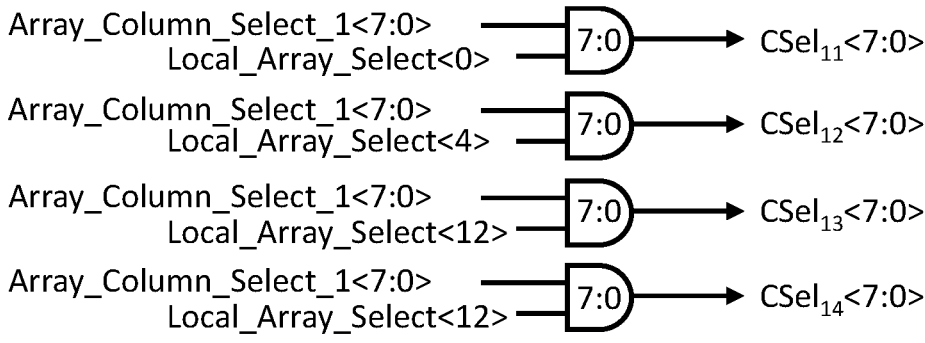

For example purposes, FIG. 5D shows the control circuit 300 for controlling individual local bit line LBL to global bit line GBL connection for the first array column (c=1) using the bits of the array column select signal (Array_Column_Select_1<7:0>). This circuit configuration would be repeated in the control circuit 200 for each of the array columns of the memory 110.

With reference once again to Example A and FIG. 4A, the bits of the local array select signal (Local_Array_Select<15:0>) would be <1, 1, 0, 0, 1, 1, 0, 0, 0, 0, 1, 1, 0, 0, 1, 1>. In response to these bits, the logical OR gates of the control circuit 300 would assert row select signals $RSel_1$, $RSel_2$, $RSel_3$ and $RSel_4$ and activate the $WLD_1$, $WLD_2$, $WLD_3$ and $WLD_4$ circuits. The logical AND gates of the control circuit 300 would assert the column select signals $CSel_{11}$, $CSel_{21}$, $CSel_{12}$, $CSel_{22}$, $CSel_{33}$, $CSel_{43}$, $CSel_{34}$ and $CSel_{44}$ and connect the local bit lines LBL of the local memory arrays $112_{11}$, $112_{21}$, $112_{12}$, $112_{22}$, $112_{33}$, $112_{43}$, $112_{34}$ and $112_{44}$ to the corresponding global bit lines. With the use of the array column select signals (Array_Column_Select_c<7:0>), a more granular control over individual local bit line LBL to global bit line GBL connections in each of the array columns can be made. For example, if the bits of the array column select signal (Array_Column_Select_1<15:0>) for the first array column of the memory 110 were <1, 1, 0, 0, 0, 0, 1, 1>, only the first, second, seventh and eighth local bit lines LBL would be connected to the corresponding global bit lines GBL. In either case, the bit or bits of the column select signals CSel would actuate the selected switches S of the column decoder circuits 200 to make desired the LBL to GBL connections.

It will be noted that changing the dimensions of the matrix for the in-memory compute operation produces a reduction in the input dynamic range of the analog signals $Y_a$ input to the analog-to-digital converter circuit. Consider, for example, the in-memory compute operation using the circuit shown in FIG. 1 and the first in-memory compute operation (IMC-OP1) performed using the circuit of FIG. 2 using the configuration shown in FIG. 4A. For a given array column, the global bit line GBL current generating the analog signal $Y_a$ in FIG. 4A will be half the bit line BL current generating the analog signal $Y_a$ in FIG. 1.

There are a number of solutions suited to address the foregoing problem.

Figure 6A:
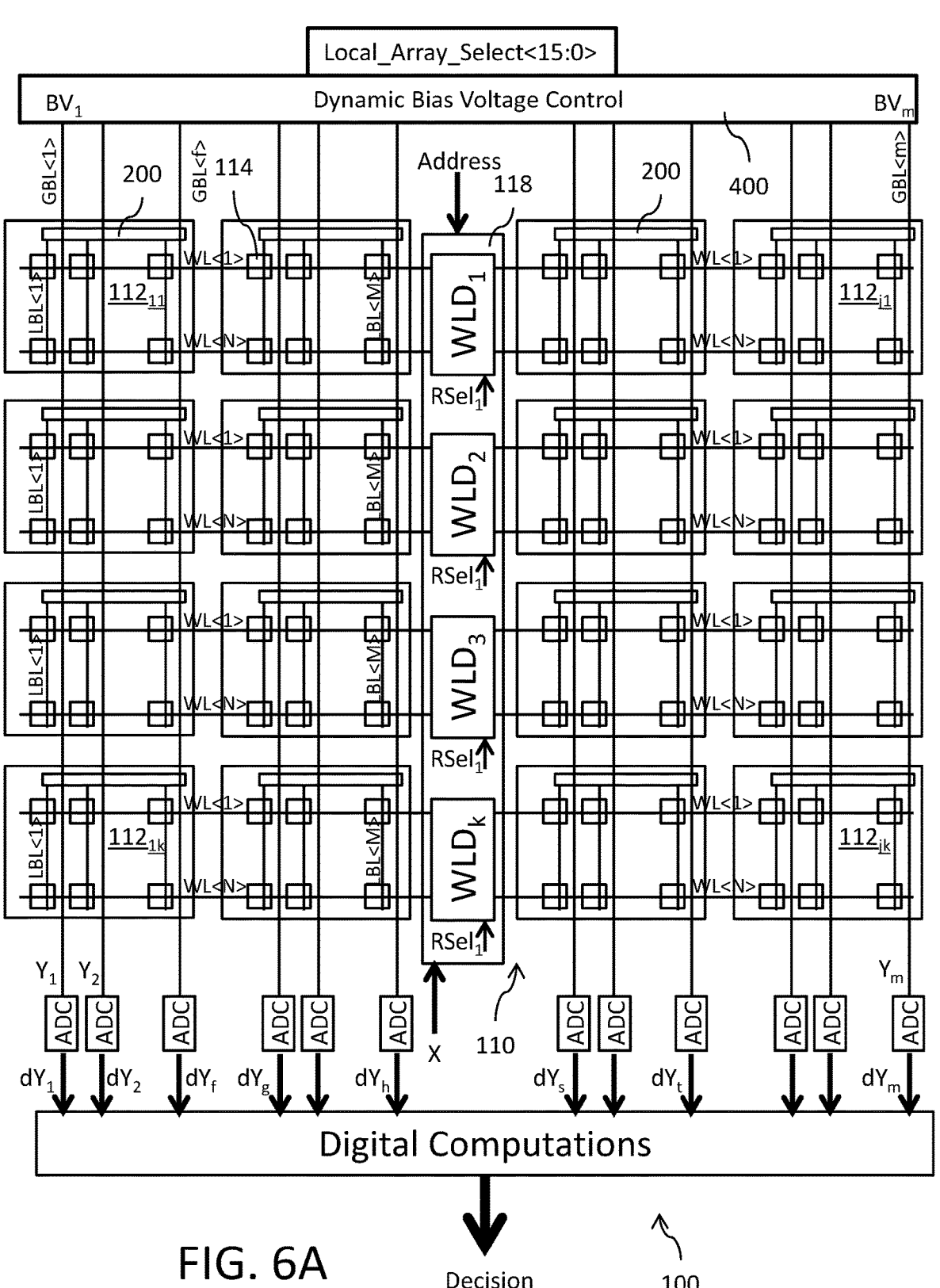
FIGS. 6A and 7A show a circuit for addressing a concern with input analog-to-digital converter dynamic range when executing in-memory compute operations with reduced matrix dimensions.
Figure 7A:
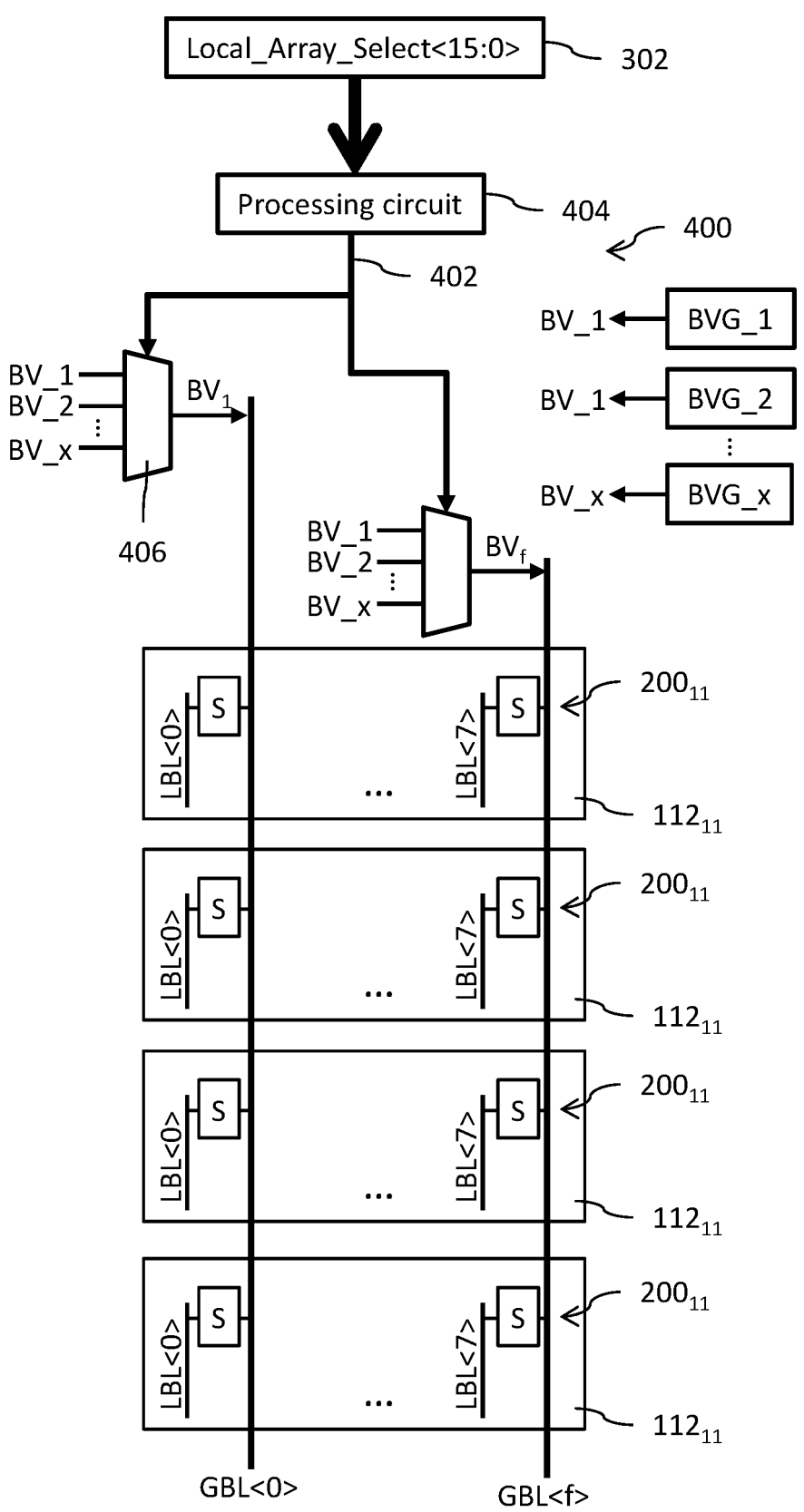

First solution: with reference to FIGS. 6A and 7A, a dynamic bias voltage control circuit 400 is connected to each of the global bit lines GBL. The dynamic bias voltage control circuit 400 controls the bias voltage $BV_m$ on each global bit line GBL dependent on matrix dimension information for each in-memory compute operation. Information concerning the matrix dimensions is provided through the bits of the local array select signal (Local_Array_Select<15:0>) which indicates which local memory arrays 112 have been selected to participate in the one or more in-memory compute operations. Based on the number of local memory arrays 112 selected in a given array column (memory column sector), the dynamic bias voltage control circuit 400 will scale the bias voltage $BV_m$ on each of the global bit lines GBL for that array column to account for the matrix dimension. Taking, for example, the configuration shown in FIG. 4A, the first array column (which includes local memory arrays $112_{11}$, $112_{12}$, $112_{13}$ and $112_{14}$) is only using two local memory arrays $112_{11}$ and $112_{12}$ for the first in-memory compute operation (IMC-OP1). To account for the reduced global bit line GBL current in the first array column, the dynamic bias voltage control circuit 400 will double (2x) the bias voltage $BV_m$ on each of the global bit lines GBL<1> to GBL<f>. In the case where, for example, only one of the four local memory arrays was used (see, FIG. 5B), the dynamic bias voltage control circuit 400 will provide 4x the bias voltage $BV_m$ on each of the global bit lines GBL<1> to GBL<f>. Where three of the four are used, the circuit 400 will provide 4x/3 scaling of the bias voltage.

In support of the dynamic control over applied bias voltages BV on the individual global bit lines GBL, the dynamic bias voltage control circuit 400 may include a number of bias voltage generator (BVG) circuits each configured to generate a different bias voltage level (BV_1, BV_2, . . . , BV_x), along with a switching (for example, multiplexing) circuit 406 at each global bit line GBL that is controlled with select signals 402 in response a processing 404 of the bits of the local array select signal (Local_Array_Select<15:0>) to select an appropriate one of the generated bias voltage levels for application to the global bit line GBL.

Figure 6B:
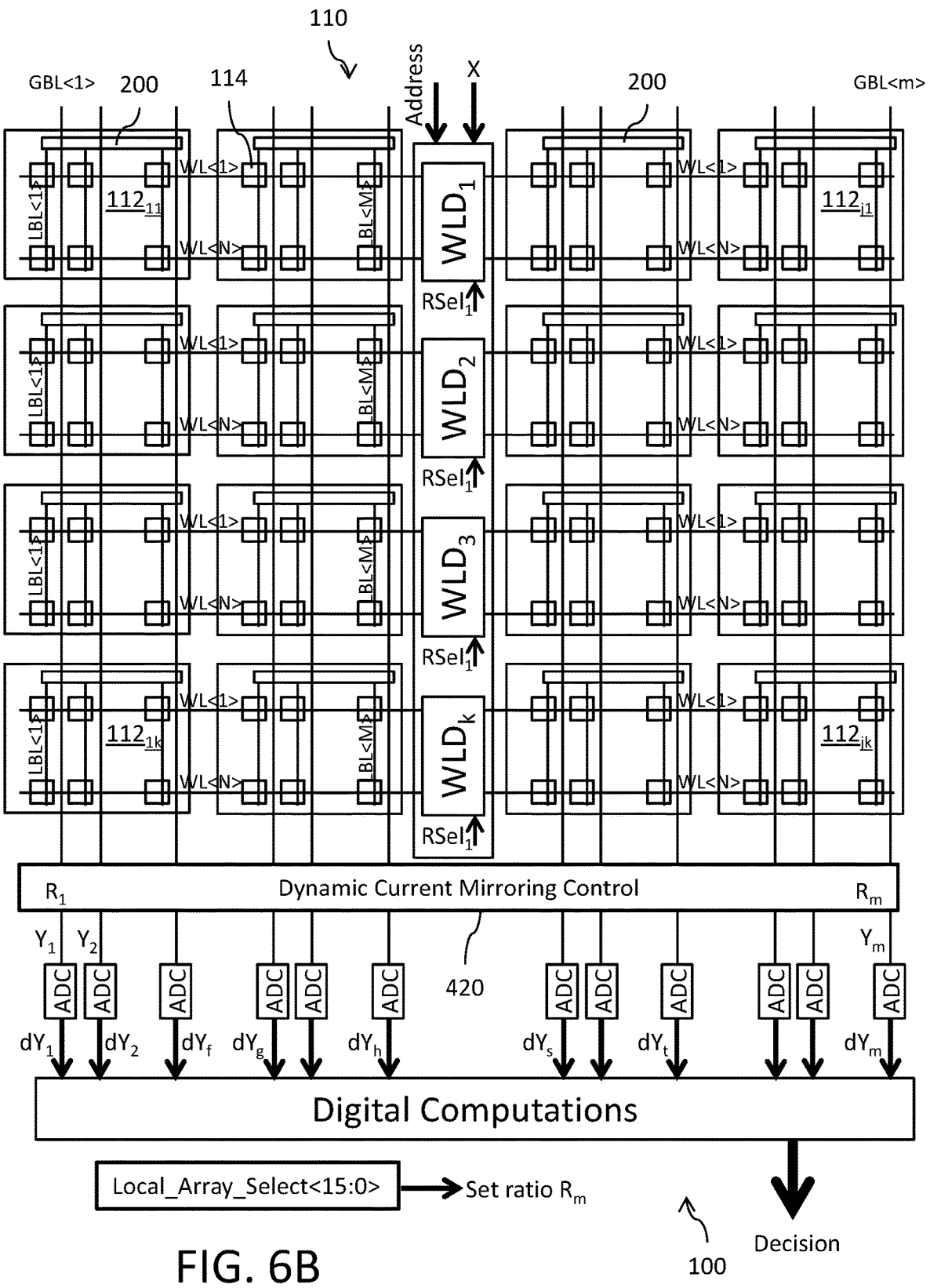
FIGS. 6B and 7B show a circuit for addressing a concern with input analog-to-digital converter dynamic range when executing in-memory compute operations with reduced matrix dimensions.
Figure 7B:
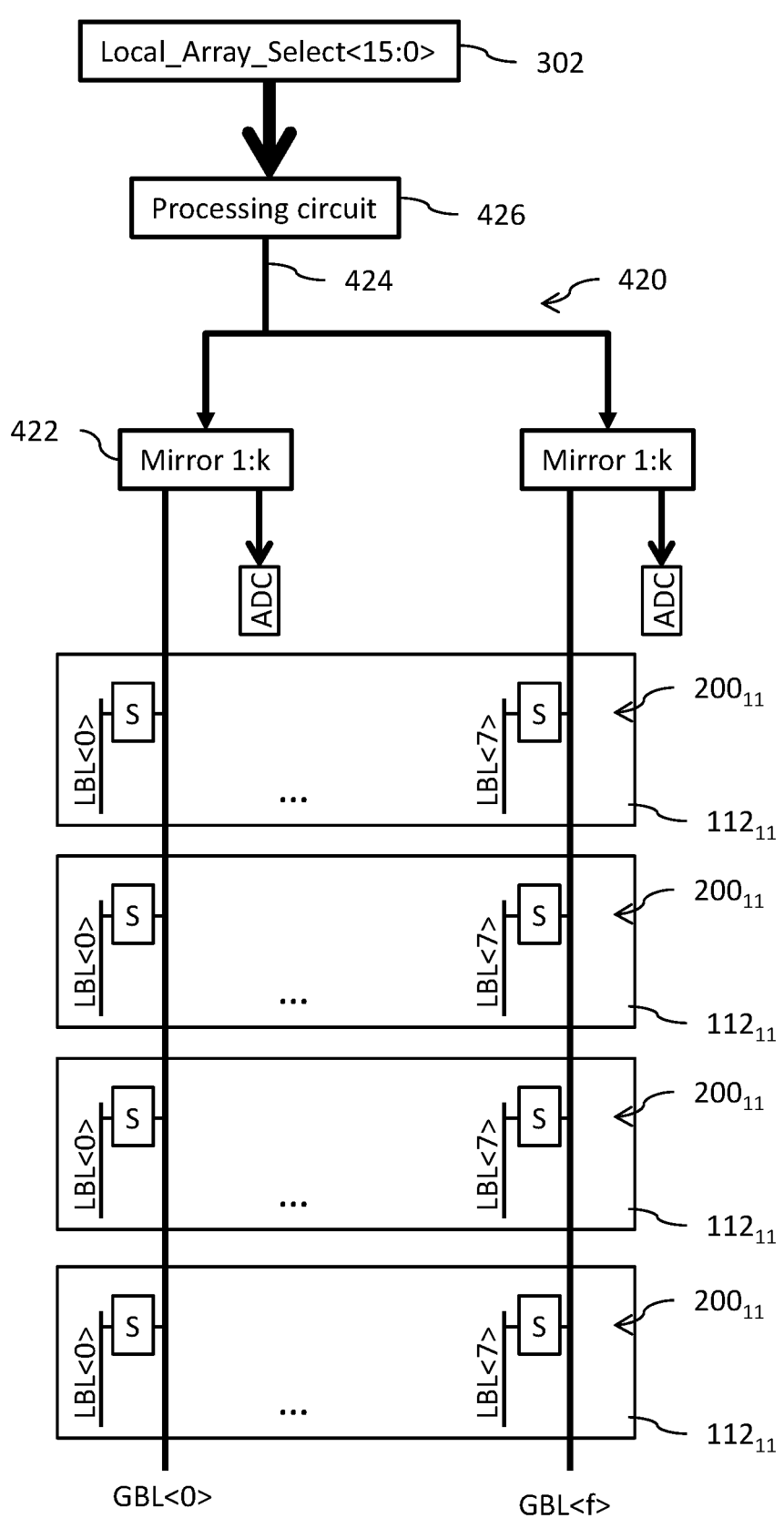

Second solution: with reference to FIGS. 6B and 7B, a dynamic current mirroring control circuit 420 is connected between the global bit lines GBL and the inputs to the ADC circuits. The dynamic current mirroring control circuit 420 controls a mirroring ratio $R_m$ applied between the input current received on the global bit line GBL and the output current applied to the input of the ADC circuit dependent on matrix dimension for each in-memory compute operation. Information concerning the matrix dimensions is provided through the bits of the local array select signal (Local_Array_Select<15:0>) which indicates which local memory arrays 112 have been selected to participate in the one or more in-memory compute operations. Based on the number of local memory arrays 112 selected in a given array column, the dynamic current mirroring control circuit 420 will scale the current mirroring ratio $R_m$ for the current on each of the global bit lines GBL for that array column to account for the matrix dimension. Taking, for example, the configuration shown in FIG. 4A, the first array column (which includes local memory arrays $112_{11}$, $112_{12}$, $112_{13}$ and $112_{14}$) is only using two local memory arrays $112_{11}$ and $112_{12}$ for the first in-memory compute operation (IMC-OP1). To account for the reduced global bit line GBL current in the first array column, the dynamic current mirroring control circuit 420 will double (2x) the mirroring ratio $R_m$ applied to the currents on each of the global bit lines GBL<1> to GBL<f>. Likewise, a 4x scaling would be provided where only one of the four local memory arrays is used, and provide a 4x/3 scaling where three of the four are used.

In support of the dynamic control over current mirroring ratio R applied to currents on the individual global bit lines GBL, the dynamic current mirroring control circuit 420 may include, at each global bit line GBL, a current mirror circuit 422 with a controllable mirror ratio $R_m$=1:k, where k can be set by control signals 424 equal to a selected one of the mirroring ratios R in response to a processing 426 of the bits of the local array select signal (Local_Array_Select<15:0>) to select an appropriate one of the current mirror ratios for scaling the current on the global bit line GBL prior to analog-to-digital conversion.

Figure 6C:
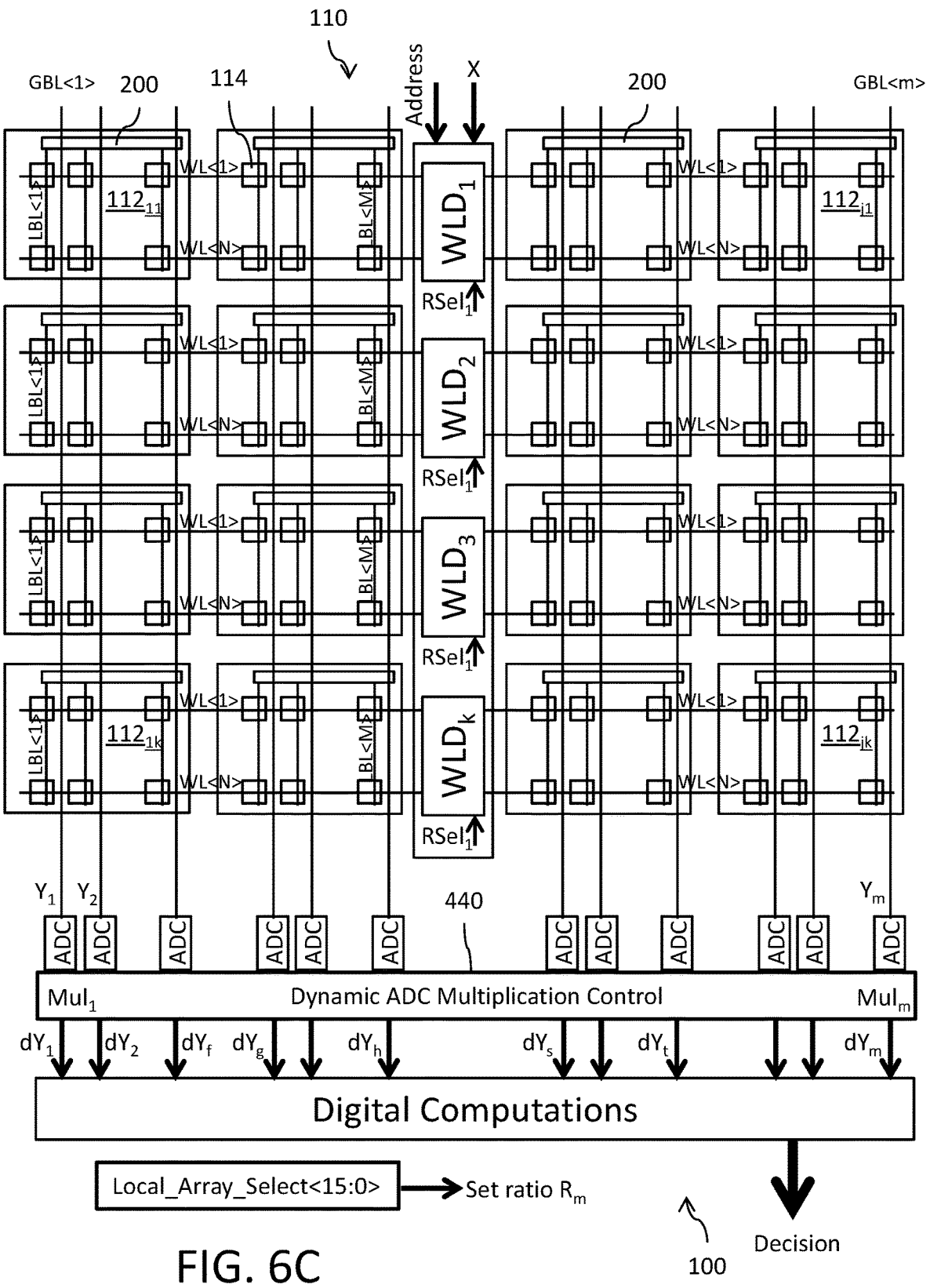
FIGS. 6C and 7C show a circuit for addressing a concern with input analog-to-digital converter dynamic range when executing in-memory compute operations with reduced matrix dimensions.
Figure 7C:
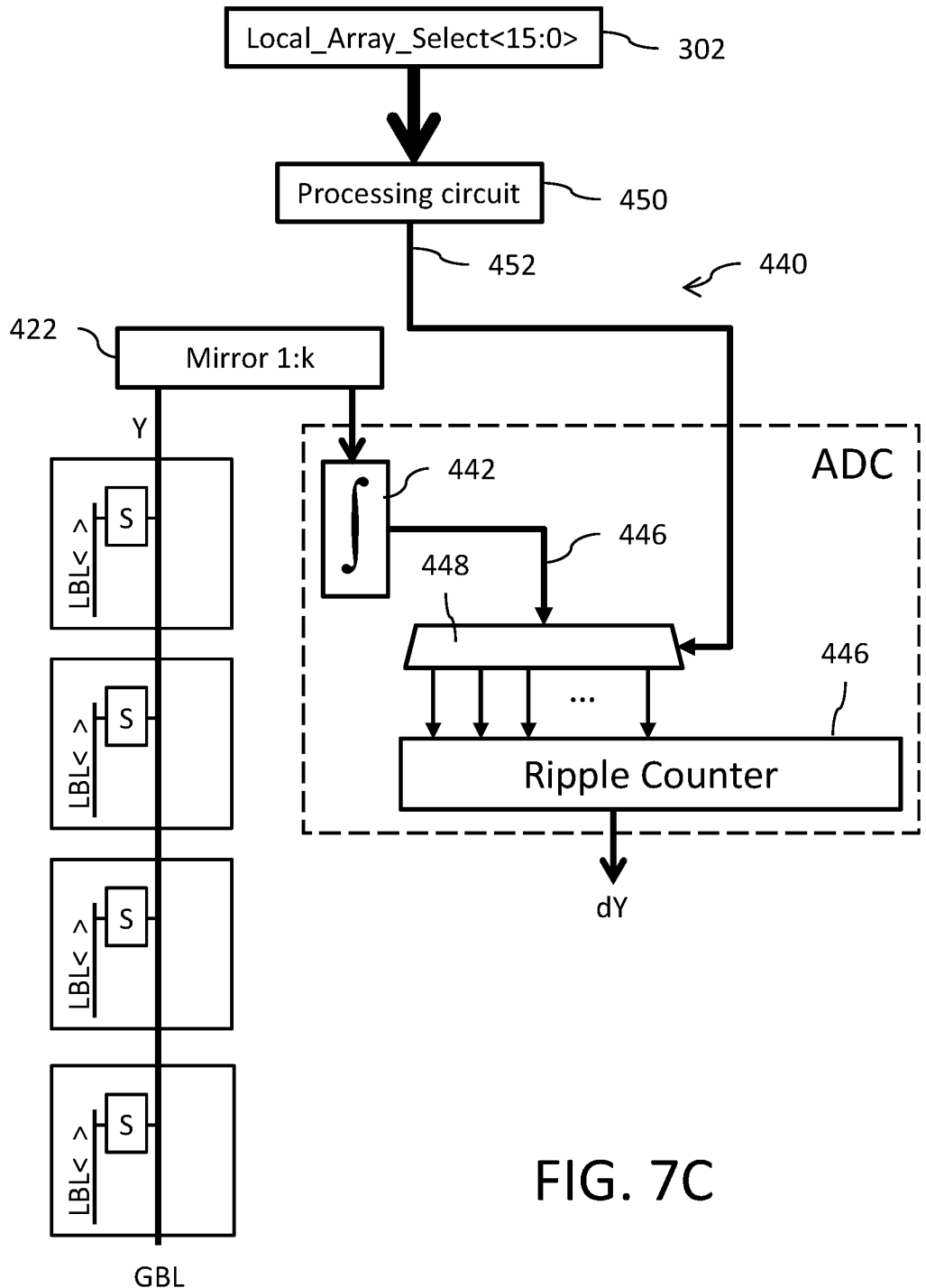

Third solution: with reference to FIGS. 6C and 7C, each ADC circuit includes an integration circuit 442 and a counter circuit 444. The integration circuit 442 integrates the current on the global bit line GBL, for example after being selectively ratioed as discussed above in connection with FIGS. 6B and 7B, to generate a clock signal 446 having a frequency that is a function of the global bit line current. The counter circuit 444 is implemented as a ripple counter and operates to count, over a certain time period, a number of pulses in the clock signal 446. The count value in the counter circuit 444 at the end of that certain time period is the digital signal dY converted from the analog signal Y.

A dynamic ADC multiplication circuit 440 is provided for the ADC circuits. The dynamic ADC multiplication circuit 440 controls a multiplication factor $Mult_m$ applied to the counting of the number of pulses in the clock signal 446 by the counter circuit 444, wherein the multiplication is dependent on the matrix dimension for each in-memory compute operation.

Information concerning the matrix dimensions is provided through the bits of the local array select signal (Local_Array_Select<15:0>) which indicates which local memory arrays 112 have been selected to participate in the one or more in-memory compute operations. Based on the number of local memory arrays 112 selected in a given array column, the dynamic ADC multiplication circuit 440 will select the multiplication factor $Mult_m$ for the pulse counting at each ADC circuit to account for the matrix dimension. Taking, for example, the configuration shown in FIG. 4A, the first array column (which includes local memory arrays $112_{11}$, $112_{12}$, $112_{13}$ and $112_{14}$) is only using two local memory arrays $112_{11}$ and $112_{12}$ for the first in-memory compute operation (IMC-OP1). To account for the reduced global bit line GBL current in the first array column, the dynamic ADC multiplication circuit 440 will select a multiplication factor $Mult_m$ of 2× (or double) to be applied when counting pulses (i.e., each pulse in the clock signal 446 will increment the count value by 2. Similarly, for the configuration shown in FIG. 4B, a multiplication factor of 4× would be applied when counting pulses (each pulse incrementing the count value by 4.

In support of the dynamic control over the multiplication factor $Mult_m$ applied when counting pulses of the clock signal 446, the dynamic ADC multiplication circuit 440 may include, at each ADC circuit, a switching circuit 448 (for example, a de-multiplexer) that receives the clock signal 446 and passes the clock signal 446 to a control signal 452 selected one of many outputs in response to a processing 450 of the bits of the local array select signal (Local_Array_Select<15:0>) to select an appropriate multiplication factor $Mult_m$. The outputs of the switching circuit 448 are connected to different latch inputs of the counter circuit 444. For example, for a multiplication factor $Mult_m=1$, the clock signal 446 is applied from an output of the switching circuit 448 to the clock input of a first latch circuit in a plurality of series connected latch circuits forming the ripple counter. For a multiplication factor $Mult_m=2$, the clock signal 446 is applied from an output of the switching circuit 448 to the clock input of a second latch circuit in the plurality of series connected latch circuits forming the ripple counter.

It will be noted that two or more of the solutions described above can be used concurrently.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An in-memory computation circuit, comprising:
   a memory including a plurality of memory cells arranged in a matrix with a plurality of cell rows and a plurality of cell columns, wherein each cell row is associated with a word line connected to the memory cells in the cell row, and wherein each cell column is associated with a global bit line;
   wherein the memory is segmented into a plurality of local memory arrays arranged in a matrix with a plurality of array rows and a plurality of array columns;
   a word line driver for each array row that is selectively enabled in response to a row select signal to drive word lines of the array row;
   wherein each local memory array includes a plurality of local bit lines connected to memory cells in the cell columns and a column decoder circuit configured to selectively connect the local bit lines to the global bit lines of the array column in response to a column select signal;
   a control circuit configured to generate row select signals for the word lines drivers and column select signals for the column decoder circuits to map a first group of one or more local memory arrays to participate in a first in-memory compute operation producing computation output signals on first ones of the global bit lines and map a second group of one or more local memory arrays, different from the first ones of the local memory arrays, to participate in a second in-memory compute operation producing computation output signals on second ones of the global bit lines, different from the first ones of the global bit lines; and
   a dynamic bias voltage control circuit configured to control a voltage level of a bias voltage applied to the first ones of the global bit lines within a first array column dependent on a number of local memory arrays within that first array column selected to participate in the first in-memory compute operation and control a voltage level of a bias voltage applied to the second ones of the global bit lines within a second array column, different from the first array column, dependent on a number of local memory arrays within that second array column selected to participate in the second in-memory compute operation;
   wherein the first and second in-memory compute operations are substantially simultaneously executed.

2. The in-memory computation circuit of claim 1, wherein the column decoder circuit responds to assertion of the column select signal to connect all local bit lines to the global bit lines of the array column.

3. The in-memory computation circuit of claim 2, wherein the control circuit comprises:
   a local array select register storing first bits, each first bit corresponding to one of the local memory arrays and indicating whether that one of the local memory arrays is participating in one of the first and second in-memory compute operations;
   an array column select register storing second bits, each second bit corresponding to one of the array columns and indicating whether any of the local memory arrays in the array column is participating in one of the first and second in-memory compute operations; and
   a logic circuit configured to logically combine first bits for the local memory arrays in an array column with the second bit for that array column to generate column select signals for the local memory arrays in that array column.

4. The in-memory computation circuit of claim 1, wherein the column decoder circuit responds to assertion of individual bits of the column select signal to selectively connect corresponding individual local bit lines to corresponding global bit lines of the array column.

5. The in-memory computation circuit of claim 4, wherein the control circuit comprises:
   a local array select register storing first bits, each first bit corresponding to one of the local memory arrays and indicating whether that one of the local memory arrays is participating in one of the first and second in-memory compute operations;
   an array column select register for each array column storing second bits, each second bit corresponding to one of the cell columns and indicating whether the cell column is participating in one of the first and second in-memory compute operations; and
   a logic circuit configured to logically the first bit for a local memory array with the second bits for the cell columns to generate column select signals for that local memory array controlling selective connection of local bit lines to global bit lines.

6. The in-memory computation circuit of claim 1, wherein the word line driver responds to assertion of the row select signal to drive all word lines of the array row.

7. The in-memory computation circuit of claim 1, wherein the word line driver responds to assertion of individual bits of the row select signal to selectively drive certain ones of the word lines of the array row.

8. The in-memory computation circuit of claim 1, wherein the control circuit comprises:
   a local array select register storing bits, each bit corresponding to one of the local memory arrays and indicating whether that one of the local memory arrays is participating in one of the first and second in-memory compute operations; and
   a logic circuit configured to logically combine bits of the row select signal corresponding to local memory arrays in an array column to generate the row select signal for the word line drive of that array column.

9. The in-memory computation circuit of claim 1, wherein the dynamic bias voltage control circuit comprises multiplexing circuitry have a plurality of inputs configured to receive different voltage levels of the bias voltage, an output coupled to the global bit lines and a selection input configured to receive a selection signal dependent on the number of local memory arrays within the array column selected to participate in the in-memory compute operation.

10. The in-memory computation circuit of claim 1, further comprising:
   a local array select register storing bits, each bit corresponding to one of the local memory arrays and indicating whether that one of the local memory arrays is participating in one of the first and second in-memory compute operations; and
   wherein the dynamic bias voltage control circuit comprises a processing circuit configured to process the bits of the local array select register to determine the number of local memory arrays in each array column that are selected to participate in each of the first and second in-memory compute operations, and select the voltage levels of the bias voltages applied to the first and second ones of the global bit lines, respectively, based on the determined number of local memory arrays.

11. An in-memory computation circuit, comprising:
   a memory array including a plurality of memory cells arranged in a matrix with plural cell rows and plural cell columns, wherein each cell row is associated with a word line coupled to the memory cells in the cell row, and wherein each cell column is associated with an output bit line coupled to memory cells in the cell column;
   a control circuit configured to map a first group of memory cells within a first column sector of the matrix to participate in a first in-memory compute operation producing computation output signals on first ones of the output bit lines from a first matrix vector multiplication of a first input vector with a first group of computation weights stored in the first group of memory cells and map a second group of memory cells within a second column sector of the matrix to participate in a second in-memory compute operation producing computation output signals on second ones of the output bit lines, different from the first ones of the output bit lines, from a second matrix vector multiplication of a second input vector, different from the first input vector, with a second group of computation weights stored in the second group of memory cells;
   a dynamic bias voltage control circuit configured to set a voltage level of a bit line bias voltage applied to the first ones of the output bit lines within the first column sector which is dependent on a ratio of a total number memory cells in the first column sector to a number of memory cells in the first group of memory cells, and set a voltage level of a bit line bias voltage applied to the second ones of the output bit lines within the second column sector dependent on a ratio of a total number of memory cells in the second column sector to a number of memory cells in the second group of memory cells; and
   wherein the first and second in-memory compute operations are substantially simultaneously executed.

12. The in-memory computation circuit of claim 11, wherein the control circuit selected certain cell rows and certain cell columns for actuation in connection with each of the first and second in-memory compute operations, the certain cell columns for the first in-memory compute operation being different from the certain cell columns for the second in-memory compute operation.

13. The in-memory computation circuit of claim 11, wherein the dynamic bias voltage control circuit comprises multiplexing circuitry have a plurality of inputs configured to receive different voltage levels of the bit line bias voltage, an output coupled to the global bit lines and a selection input configured to receive a selection signal dependent on the ratio.

14. An in-memory computation circuit, comprising:
   a memory segmented into a plurality of local memory arrays arranged in a matrix;
   a global bit line for each cell column of the memory, wherein the global bit is connected to local bit lines of the local memory arrays;
   a word line driver for each array row of the memory that is selectively enabled to drive word lines of the array row;
   a control circuit configured to map a first number of local memory arrays in a first array column of the matrix to participate in a first in-memory compute operation producing computation output signals on first ones of the global bit lines for that first array column and map a second number of local memory arrays, different from the first ones of the local memory arrays, in a second array column of the matrix to participate in a second in-memory compute operation producing computation output signals on second ones of the global bit lines, different from the first ones of the global bit lines, for that second array column;

a dynamic bias voltage control circuit configured to scale a bias voltage level by a first fraction dependent on the first number and a total number of local memory arrays in the first array column for application to global bit lines of the first array column and scale said bias voltage level by a second fraction dependent on the second number and a total number of local memory arrays in the second array column for application to global bit lines of the second array column; and wherein the first and second in-memory compute operations are substantially simultaneously executed.

15. The in-memory computation circuit of claim 14, wherein the dynamic bias voltage control circuit comprises multiplexing circuitry have a plurality of inputs configured to receive different scaled bias voltage levels, an output coupled to the global bit lines and a selection input configured to receive a selection signal dependent on the fraction.

* * * * *